(12) United States Patent
Jung et al.

(10) Patent No.: US 11,726,046 B2
(45) Date of Patent: Aug. 15, 2023

(54) MULTI-SCALE SPECTRAL IMAGING APPARATUSES AND METHODS, AND METHODS OF MANUFACTURING SEMICONDUCTOR DEVICES BY USING THE IMAGING METHODS

(71) Applicant: Samsung Electronics Co., Ltd., Suwon-si (KR)

(72) Inventors: Jaehwang Jung, Suwon-si (KR);
Hyejin Shin, Hwaseong-si (KR);
Wookrae Kim, Suwon-si (KR);
Gwangsik Park, Hwaseong-si (KR);
Myungjun Lee, Seongnam-si (KR);
Yongju Jeon, Hwaseong-si (KR)

(73) Assignee: Samsung Electronics Co., Ltd.

( * ) Notice: Subject to any disclaimer, the term of this patent is extended or adjusted under 35 U.S.C. 154(b) by 295 days.

(21) Appl. No.: 17/225,275

(22) Filed: Apr. 8, 2021

(65) Prior Publication Data

US 2022/0074867 A1    Mar. 10, 2022

(30) Foreign Application Priority Data

Sep. 4, 2020  (KR) .......................... 10-2020-0113195

(51) Int. Cl.
*G01N 21/95* (2006.01)
*G01B 11/25* (2006.01)

(52) U.S. Cl.
CPC ....... *G01N 21/9501* (2013.01); *G01B 11/254* (2013.01); *G01B 2210/56* (2013.01)

(58) Field of Classification Search
CPC .......................... G01B 11/254; G01B 2210/56

USPC ...................................................... 356/237.2
See application file for complete search history.

(56) References Cited

U.S. PATENT DOCUMENTS

| 5,963,326 A | 10/1999 | Masao |
| 6,278,519 B1* | 8/2001 | Rosencwaig ...... G01B 11/0641 |
| | | 250/225 |
| 6,297,880 B1 | 10/2001 | Rosencwaig et al. |
| 6,713,753 B1 | 3/2004 | Rovira et al. |
| 6,850,333 B1 | 2/2005 | Johnson et al. |
| 7,692,792 B2 | 4/2010 | Kiers et al. |
| 9,400,254 B2 | 7/2016 | Shcherbakov et al. |
| 9,976,966 B2 | 5/2018 | Shibata et al. |

(Continued)

FOREIGN PATENT DOCUMENTS

KR    101928439 B1    12/2018

*Primary Examiner* — Michelle M Iacoletti
*Assistant Examiner* — Omar H Nixon
(74) *Attorney, Agent, or Firm* — Myers Bigel, P.A.

(57) ABSTRACT

An imaging apparatus includes a light source configured to generate and output light, a stage having a measurement target thereon, a line-scan spectral imaging (SI) optical system configured to measure the measurement target using a first scale and to slopingly irradiate the light from the light source onto the measurement target in a line beam shape, divide light reflected by the measurement target, and perform imaging of the divided light, and an angle-resolved SI optical system configured to measure the measurement target at a second scale that is smaller than the first scale and configured to divide the light from the light source into monochromatic light, slopingly irradiate the monochromatic light onto the measurement target by using a reflective objective lens, and perform imaging of light reflected by the measurement target.

15 Claims, 26 Drawing Sheets

(56) References Cited

U.S. PATENT DOCUMENTS

| | | |
|---|---|---|
| 9,995,648 B2 | 6/2018 | Shchekin et al. |
| 2005/0140988 A1 | 6/2005 | Lee et al. |
| 2019/0227336 A1 | 7/2019 | Parrett et al. |
| 2020/0225151 A1* | 7/2020 | Wang ................. G01N 21/3563 |
| 2020/0243400 A1* | 7/2020 | Wang ..................... G01B 11/02 |

* cited by examiner

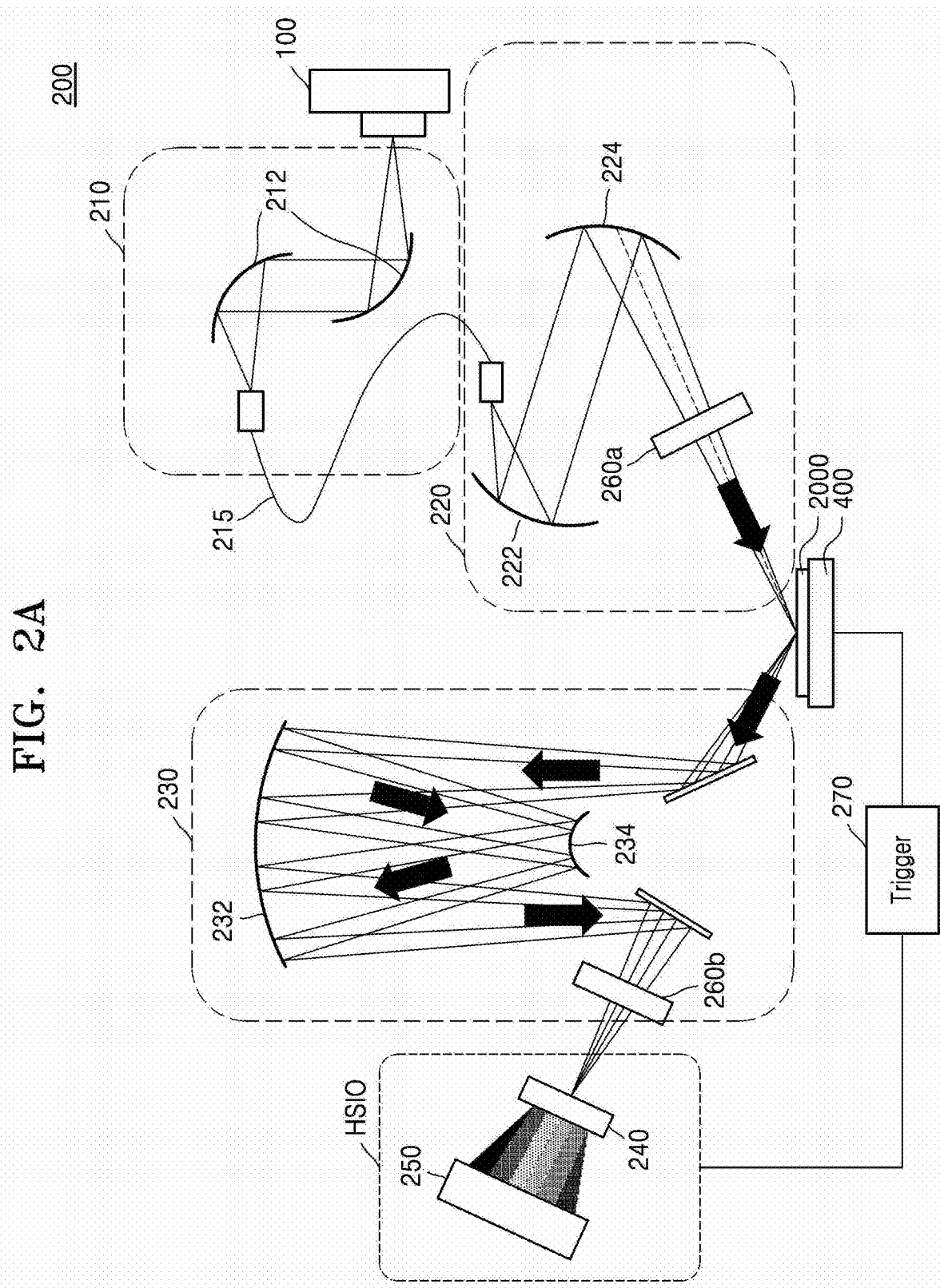

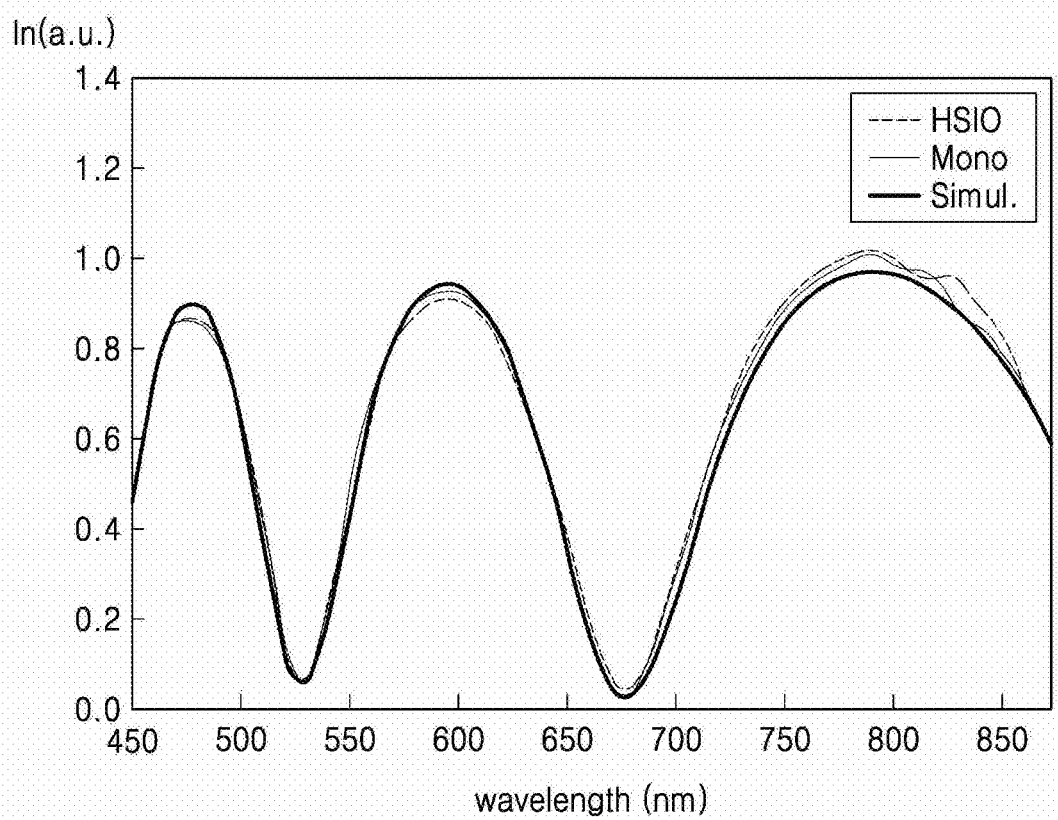

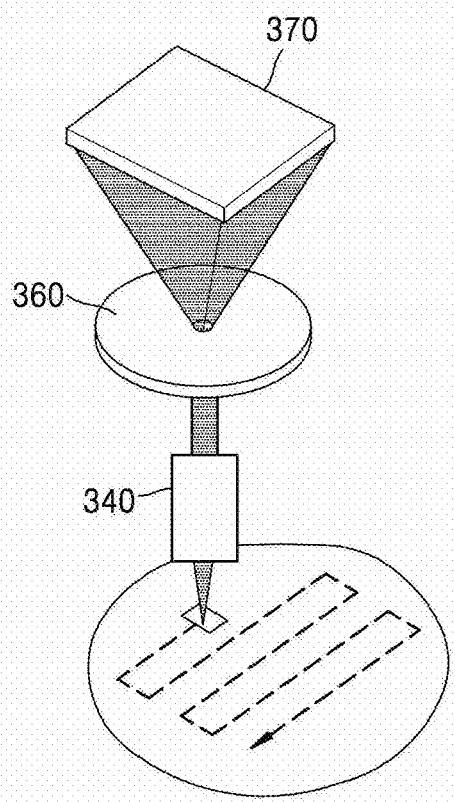

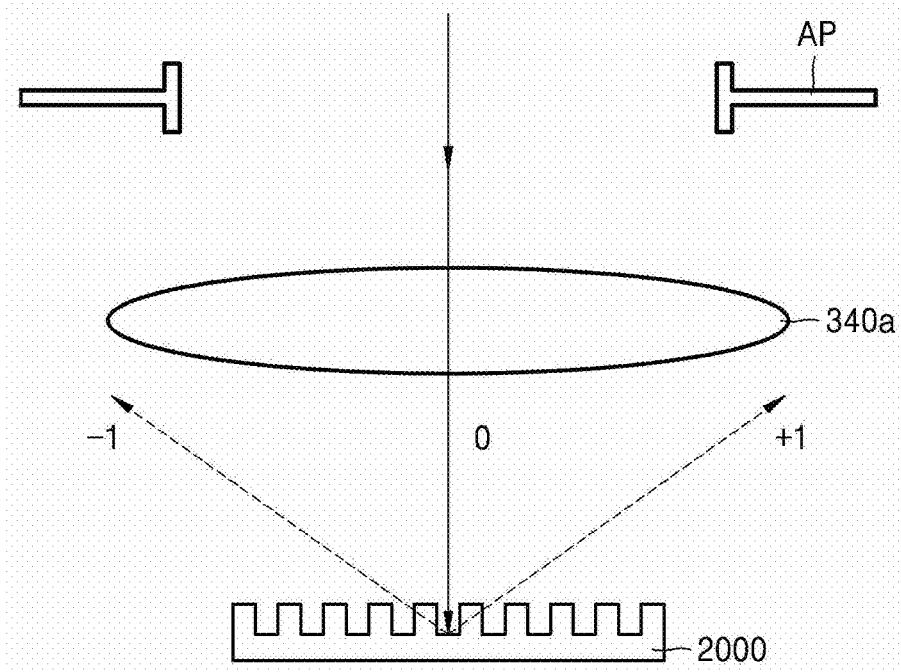

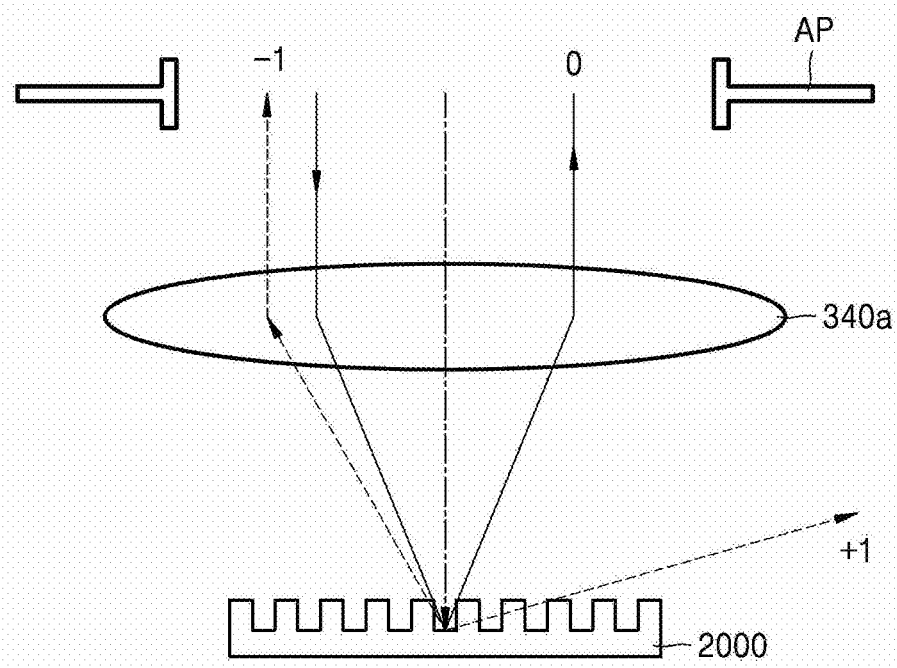

MULTI-SCALE SPECTRAL IMAGING APPARATUSES AND METHODS, AND METHODS OF MANUFACTURING SEMICONDUCTOR DEVICES BY USING THE IMAGING METHODS

CROSS-REFERENCE TO RELATED APPLICATION

This application is based on and claims priority under 35 U.S.C. § 119 to Korean Patent Application No. 10-2020-0113195, filed on Sep. 4, 2020, in the Korean Intellectual Property Office, the disclosure of which is incorporated by reference herein in its entirety.

BACKGROUND

The present disclosure relates to imaging apparatuses and related methods. Recently, design rules for semiconductor manufacturing processes have shrunk, thus resulting in smaller pattern sizes. Also, with respect to a measurement apparatus for measuring a pattern or a defect of a wafer or a mask, a problem such as a reduction in sensitivity and/or a reduction in measurement accuracy due to a reduced pattern size may occur. To address such problems, a method of enhancing optical resolution has been researched and developed. As a process may be complicated, an influence based on a changed process may be independently shown in various scales. In a measurement apparatus based on a point measurement method, hundreds to thousands of hours or more may be used in measuring an entire surface of a wafer, and there may be a limitation where it is fundamentally unable to sense non-uniformity, which may be less than or equal to a spot size.

SUMMARY

The inventive concept provides a spectrum-based imaging apparatus and method and a method of manufacturing a semiconductor device by using the imaging method, which perform measurement of various scales, perform measurement on a large area at a high speed, and precisely perform measurement on a small region at a high resolution.

According to an aspect of the inventive concept, there is provided a multi-scale spectral imaging apparatus including a light source configured to generate and output light, a stage having a measurement target thereon, a line-scan spectral imaging (SI) optical system configured to measure the measurement target using a first scale and to slopingly irradiate the light from the light source onto the measurement target in a line beam shape, divide light reflected by the measurement target into divided light, and perform imaging of the divided light, and an angle-resolved SI optical system configured to measure the measurement target at a second scale that is smaller than the first scale and configured to divide the light from the light source into monochromatic light, slopingly irradiate the monochromatic light onto the measurement target by using a reflective objective lens, and perform imaging of light reflected by the measurement target.

According to another aspect of the inventive concept, there is provided a multi-scale spectral imaging apparatus including a light source configured to generate and output light, a stage having a measurement target thereon, a line-scan spectral imaging (SI) optical system including a first input optical system including a parabolic mirror configured to transfer the light from the light source to an optical fiber, a second input optical system including a line beam forming mirror configured to convert light from the optical fiber into a line beam and to slopingly irradiate the line beam onto the measurement target, a spectral device configured to divide light reflected by the measurement target, and a first detector configured to detect light obtained through the division by the spectral device, and an angle-resolved SI optical system including a high speed spectral module configured to divide the light from the light source, an incident angle control module configured to perform control to slopingly irradiate light from the high speed spectral module onto the measurement target, a reflective objective lens configured to slopingly irradiate light from the incident angle control module onto the measurement target, a second detector configured to detect light reflected by the measurement target from a pupil surface, and a third detector configured to detect the light reflected by the measurement target from an imaging surface of the third detector.

According to another aspect of the inventive concept, there is provided a multi-scale spectral imaging method including performing a first measurement on a whole region of a measurement target by using a line-scan spectral imaging (SI) optical system at a first scale, selecting an error area or an error-suspicious area in the measurement target based on a result of the first measurement, and performing a second measurement on the error area or the error-suspicious area by using an angle-resolved SI optical system at a second scale that is smaller than the first scale, wherein the line-scan SI optical system is configured to slopingly irradiate light onto the measurement target in a line beam shape, divide light reflected by the measurement target into divided light, and perform imaging of the divided light, and the angle-resolved SI optical system is configured to divide the light into monochromatic light, slopingly irradiate the monochromatic light onto the measurement target by using a reflective objective lens, and perform imaging of light reflected by the measurement target.

According to another aspect of the inventive concept, there is provided a method of manufacturing a semiconductor device, the method including preparing a semiconductor device including a measurement target, performing a first measurement on a whole region of the semiconductor device by using a line-scan spectral imaging (SI) optical system at a first scale, selecting an error area or an error-suspicious area in the semiconductor device based on a result of the first measurement, performing a second measurement on the error area or the error-suspicious area by using an angle-resolved SI optical system at a second scale that is smaller than the first scale, determining whether the semiconductor device is abnormal, based on a result of the second measurement, and when the semiconductor device is normal, performing a subsequent process on the semiconductor device, wherein the line-scan SI optical system is configured to slopingly irradiate light onto the measurement target in a line beam shape, divide light reflected by the measurement target into divided light, and perform imaging of the divided light, and the angle-resolved SI optical system is configured to divide the light into monochromatic light, slopingly irradiate the monochromatic light onto the measurement target by using a reflective objective lens, and perform imaging of light reflected by the measurement target.

BRIEF DESCRIPTION OF THE DRAWINGS

Embodiments of the inventive concept will be more clearly understood from the following detailed description taken in conjunction with the accompanying drawings in which:

FIGS. 2A and 2B are structure/schematic diagrams of a line-scan SI optical system, in the spectral imaging apparatus of FIG. 1;

FIG. 4 is a graph showing a result of measurement by the line-scan SI optical system of FIG. 2A;

FIGS. 5A and 5B are structure/schematic diagrams of an angle-resolved SI optical system, in the spectral imaging apparatus of FIG. 1

FIGS. 7A and 7B are conceptual diagrams for describing the principle that measurement sensitivity increases based on the sloped irradiation of light by an objective lens;

DETAILED DESCRIPTION

Hereinafter, embodiments will be described in detail with reference to the accompanying drawings. Like numeral references refer to like elements, and their repetitive descriptions may be omitted.

Figure 1:
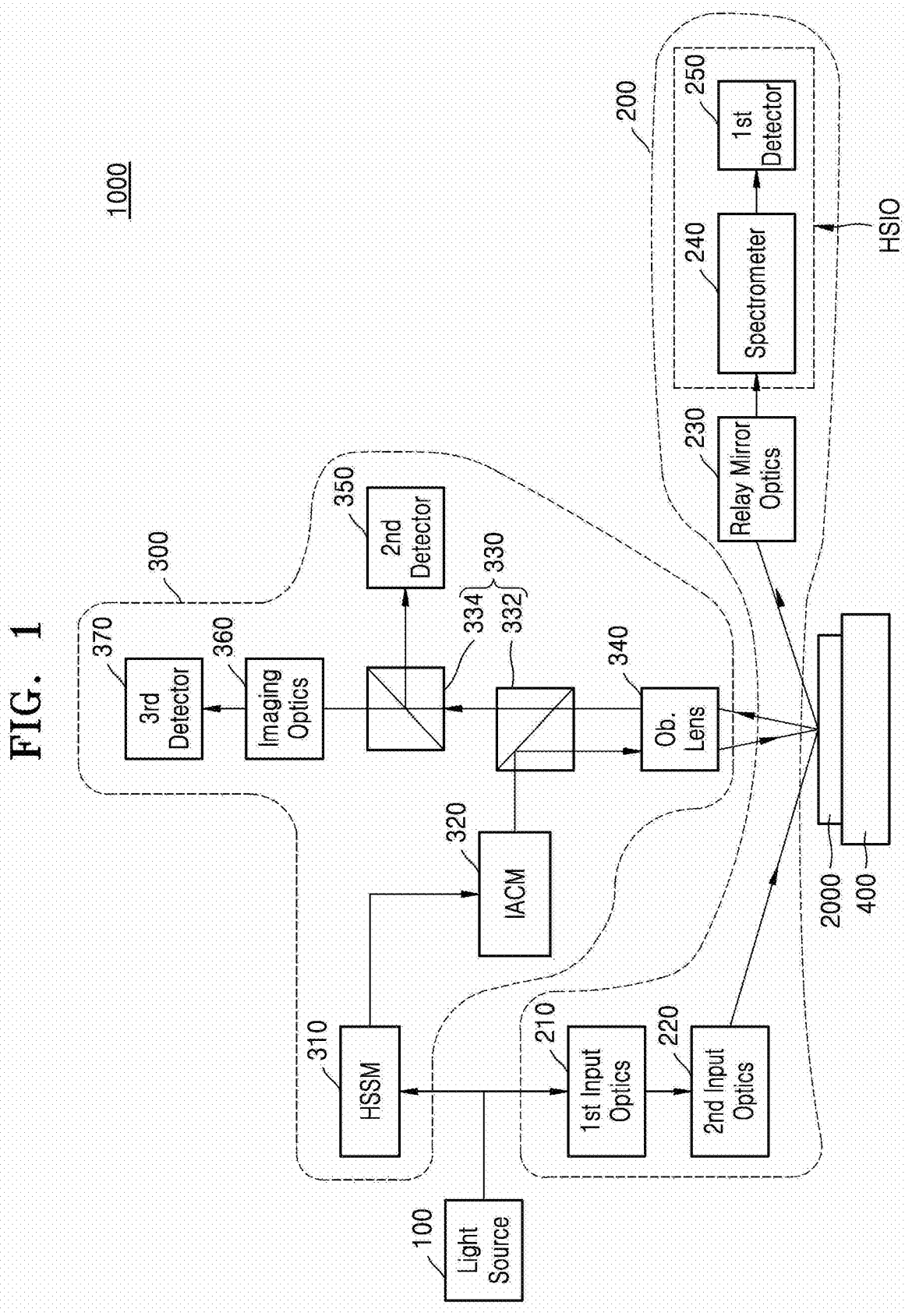
FIG. 1 is a schematic block diagram illustrating a multi-scale spectral imaging apparatus according to an embodiment.

FIG. 1 is a schematic block diagram illustrating a multi-scale spectral imaging apparatus 1000 according to an embodiment.

Referring to FIG. 1, the multi-scale spectral imaging (SI) apparatus (hereinafter simply referred to as an SI apparatus) 1000 according to an embodiment may include a light source 100, a line-scan SI optical system 200, an angle-resolved SI optical system 300, and a stage 400.

The light source 100 may generate and output light of a broadband. For example, the light source 100 may generate and output light of a broadband having a wavelength range of about 180 nanometers (nm) to about 20,000 nm. However, a wavelength range of light of the light source 100 is not limited to a numerical range described above. For example, the light source 100 may generate and output light having a wavelength range of about 250 nm to about 1,100 nm, which is a relatively narrow range.

In the SI apparatus 1000 according to an embodiment, one light source 100 may be provided. Therefore, the light source 100 may supply light to each of the line-scan SI optical system 200 and the angle-resolved SI optical system 300. However, according to some embodiments, two light sources 100 may be provided, and in this case, each of the line-scan SI optical system 200 and the angle-resolved SI optical system 300 may be supplied with light from a corresponding light source 100 of the two light sources 100.

The line-scan SI optical system 200 may shape light, supplied from the light source 100, into a line beam shape and may slopingly irradiate the shaped light onto a measurement target 2000, and moreover, may spectralize light reflected by the measurement target 2000 to image the spectralized light into a two-dimensional (2D) array image. In the 2D array image, one axis may correspond to a line of a line beam, and one other axis may correspond to a wavelength. The line-scan SI optical system 200 may include a first input optical system 210, a second input optical system 220, a relay mirror optical system 230, a spectral device (e.g., spectrometer) 240, and a first detector 250. In the line-scan SI optical system 200, the spectral device 240 and the first detector 250 may configure, for example, a hyper-spectral imaging (HSI) optical system HSIO. According to some embodiments, the HSI optical system HSIO may further include a slit corresponding to a line beam. The line-scan SI optical system 200 may be used for a case which measures the measurement target 2000 at a resolution of a first scale (for example, a pixel resolution of about several micrometers (μm)) and at a high speed. The line-scan SI optical system 200 will be described below in more detail with reference to FIGS. 2A to 2C.

The angle-resolved SI optical system 300 may divide the light, supplied from the light source 100, into monochromatic light and may slopingly irradiate the monochromatic light onto a reflective objective lens 340, and moreover, may image light, reflected by the measurement target 2000, into a 2D image. The angle-resolved SI optical system 300 may obtain, for example, a wavelength-based 2D image. The angle-resolved SI optical system 300 may include a high speed spectral module (HSSM) 310, an incident angle control module (IACM) 320, a beam splitter unit 330, the reflective objective lens 340, a second detector 350, an imaging optical system 360, and a third detector 370. The angle-resolved SI optical system 300 may be used for a case which precisely measures a certain region of the measurement target 2000 at a resolution of a second scale (for example, a pixel resolution of about tens of nm). The angle-resolved SI optical system 300 will be described below in more detail with reference to FIGS. 5A to 5C.

The stage 400 may support and fix the measurement target 2000. For example, the measurement target 2000 may be disposed on a top surface of the stage 400, and the stage 400 may support and fix a bottom surface of the measurement target 2000. The stage 400 may include a three-dimensional (3D) movement stage, which is three-dimensionally movable. As the stage 400 moves, the measurement target 2000 may move together with the stage 400. For example, by moving the stage 400, z-axis focusing or x-y plane scanning may be performed on the measurement target 2000. Here, the z axis may correspond to a normal line vertical to a top surface of the measurement target 2000 or the stage 400, and the x-y plane may correspond to a top surface of the measurement target 2000 or the stage 400 or may correspond to a plane vertical to the z axis.

The measurement target 2000 may include, for example, a wafer or a mask including a pattern. Also, the measurement target 2000 may include a semiconductor device including a multi-pattern layer and an overlay mark. Here, the overlay mark may include a mark for measuring an overlay error of the multi-pattern layer, and the overlay error may denote the degree of misalignment between an upper pattern and a lower pattern in the multi-pattern layer. Therefore, the SI apparatus 1000 according to an embodiment may measure and analyze various characteristics of the measurement target 2000. For example, the SI apparatus 1000 according to an embodiment may measure and analyze an overlay error, a pattern size, a pattern thickness, and pattern uniformity. Also, according to some embodiments, the SI apparatus 1000 may detect a defect such as particles or a pattern defect of the measurement target 2000.

In the SI apparatus 1000 according to an embodiment, the stage 400 may be shared and used by the line-scan SI optical system 200 and the angle-resolved SI optical system 300. Therefore, the SI apparatus 1000 according to an embodiment may solve a problem of coordinates precision (i.e., an issue for matching coordinates) between the line-scan SI optical system 200 and the angle-resolved SI optical system 300. Also, measurement may be performed on the same measurement target 2000 on the stage 400, and thus, movement/standby between pieces of equipment may not be needed, thereby solving a problem of time delay in a process which needs measurement for a limited time.

The SI apparatus 1000 shown in FIG. 1 may include the line-scan SI optical system 200 and the angle-resolved SI optical system 300, and thus, may measure the measurement target 2000 having a large area at a high speed by using the line-scan SI optical system 200, and moreover, may precisely measure a small region, corresponding to an error/error-suspicious area of the measurement target 2000, at a high resolution by the angle-resolved SI optical system 300.

Also, the SI apparatus 1000 according to some embodiments may measure all of a chip corresponding to the measurement target 2000 by using the line-scan SI optical system 200, and thus, may check an internal distribution of the chip and may measure an inner portion of a cell of the chip by the angle-resolved SI optical system 300, thereby checking an internal distribution of the cell. As a result, the SI apparatus 1000 according to some embodiments may measure various regions of the measurement target 2000 at a resolution of a corresponding scale, and thus, may accurately check the structure uniformity of the corresponding regions.

Furthermore, the line-scan SI optical system 200 and the angle-resolved SI optical system 300 may share the stage 400, and thus, the SI apparatus 1000 according to some embodiments may solve a problem of coordinates precision between the line-scan SI optical system 200 and the angle-resolved SI optical system 300 and a problem of time delay in a process which needs measurement for a limited time.

Figure 2B:
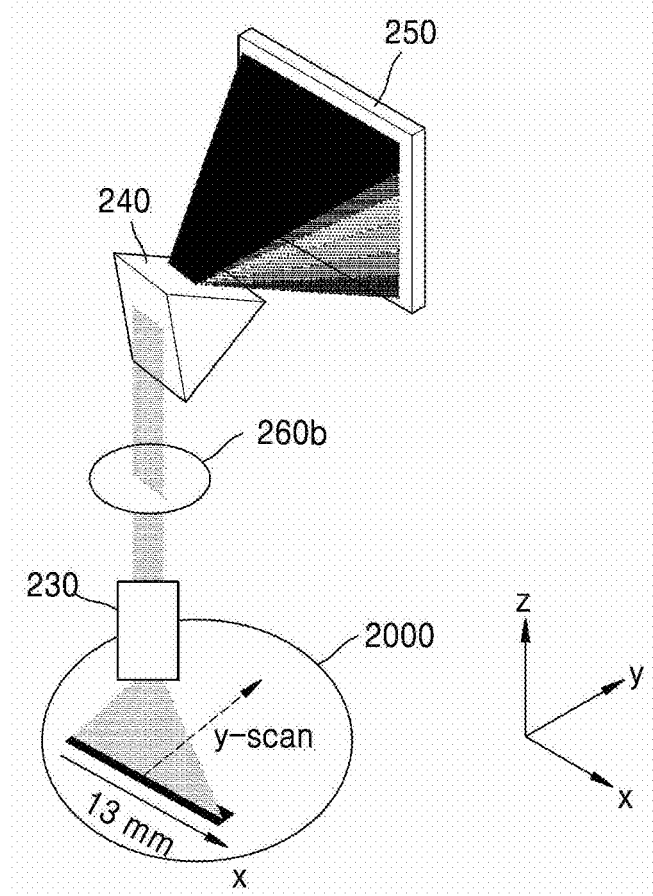
Figure 2C:
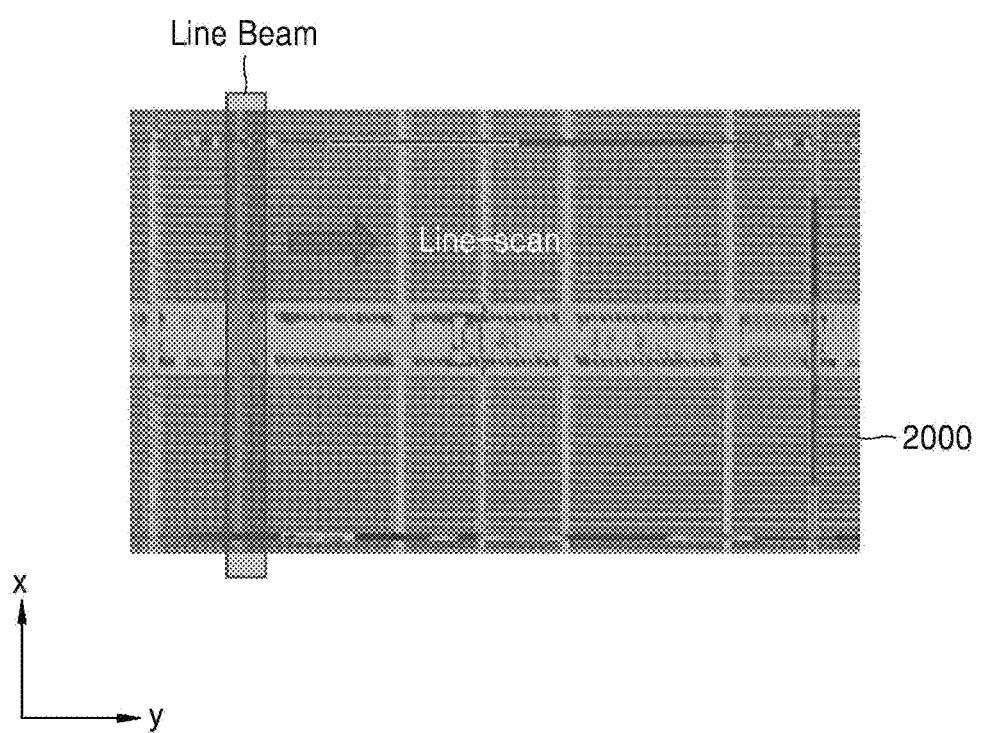
FIG. 2C is a conceptual diagram of the line-scan SI optical system, in the spectral imaging apparatus of FIG. 1.

FIG. 2A is a structure diagram of a line-scan SI optical system, in the SI apparatus 1000 of FIG. 1, FIG. 2B illustrates a simplified relay mirror optical system and a simplified HSI optical system HSIO of the line-scan SI optical system of FIG. 2A, and FIG. 2C illustrates a concept of a line-scan. Description which is the same as or similar to description given above with reference to FIG. 1 may be briefly given below or omitted.

Referring to FIGS. 2A to 2C, in an SI apparatus 1000 according to some embodiments, a line-scan SI optical system 200 may include a first input optical system 210, a second input optical system 220, a relay mirror optical system 230, a spectral device 240, and a first detector 250.

The first input optical system 210 may include, for example, an off-axis parabolic mirror 212. The parabolic mirror 212 may transfer light, supplied from a light source 100, to an optical fiber 215 without distortion. For example, the parabolic mirror 212 may transfer light to the optical fiber 215 while limiting/minimizing aberration such as spherical aberration.

The second input optical system 220 may include a collimating mirror 222 and a line beam forming mirror 224. The collimating mirror 222 may shape light, transferred from the optical fiber 215, into a parallel light shape. The line beam forming mirror 224 may shape parallel light, transferred from the collimating mirror 222, into a line beam shape which extends in one direction. For example, the line beam forming mirror 224 may be implemented as a cylindrical mirror. The cylindrical mirror may have a semicircular pillar shape, and light incident on a flat surface may be output to a curve portion and may be converted into a line beam shape. According to some embodiments, the line beam forming mirror 224 may be replaced by a slit plate where a slit thereof is formed in one direction. The parallel light may pass through the slit plate and may be converted into a line beam shape on the basis of a shape of the slit. Also, according to some embodiments, the line beam forming mirror 224 may be implemented as a line beam forming lens. In order to generate a polarization state, a rotary (e.g., rotation) polarizer 260a may be disposed in the second input optical system 220. According to some embodiments, the rotary polarizer 260a may be omitted.

The relay mirror optical system 230 may transfer light, reflected by a measurement target 2000, to an HSI optical system HSIO without distortion. For example, the relay mirror optical system 230 may be implemented as an Offner optical system. The Offner optical system, as illustrated in FIG. 2A, may include a concave mirror 232 and a convex mirror 234. However, the relay mirror optical system 230 is not limited to the Offner optical system. Also, light having a line beam shape may have a line beam shape even after being reflected by the measurement target 2000, and moreover, may still have a line beam shape despite passing through the relay mirror optical system 230. In order to analyze a polarization state, a rotary analyzer 260b may be disposed in the relay mirror optical system 230. According to an embodiment, the rotary analyzer 260b may be omitted. The rotary analyzer 260b may be substantially the same as the rotary polarizer 260a in terms of a structure and a function. The rotary polarizer 260a and the rotary analyzer 260b will be described in more detail in describing a polarization state generator (PSG) and a polarization state analyzer (PSA).

The HSI optical system HSIO may include the spectral device 240 and the first detector 250. The spectral device 240 may divide light from the relay mirror optical system 230 and may irradiate the divided light to the first detector 250. The spectral device 240 may be implemented as, for example, a diffraction grating. According to some embodiments, the spectral device 240 may be implemented as a prism.

The first detector 250 may include a region camera for obtaining a 2D array image. In the 2D array image, one axis may correspond to a wavelength, and one other axis may correspond to a line of a line beam. For example, as illustrated in FIG. 2A, the line of the line beam may extend in a first direction (an x direction). Therefore, in the 2D array image, the first direction (the x direction) may include position information about the line of the line beam, and a third direction (a z direction) may include information about a wavelength. The line beam may scan and measure the measurement target 2000 (for example, a wafer) while scanning the measurement target 2000 in a second direction (a y direction), and thus, the first detector 250 may obtain a 3D image of the measurement target 2000. In the 3D image, one axis may correspond to a wavelength, one other axis may correspond to a line of a line beam, and one other axis may correspond to a scan direction. Such a 3D image may be referred to as a hyper-cube image. For reference, in FIG. 2A, with respect to the measurement target 2000, the first direction may be a direction vertical to a paper plane, and the second direction may be a direction in which the measurement target 2000 extends.

In FIG. 2B, the spectral device 240 is illustrated as a prism. Also, the relay mirror optical system 230 and the rotary analyzer 260b may be simplified and represented. Furthermore, although not shown, according to some embodiments, a slit plate where a slit is provided may be further disposed between the relay mirror optical system 230 and the first detector 250.

In the SI apparatus 1000 according to some embodiments, the line-scan SI optical system 200 may optionally include a trigger system 270. The trigger system 270 may include a system which synchronizes a time, at which the first detector 250 captures an image, with movement of the measurement target 2000 by the stage 400, in a scan operation. Because the line-scan SI optical system 200 includes the trigger system 270, a defect may be reduced/minimized in repeated measurements performed on the same region. An effect of the trigger system 270 will be described below in more detail with reference to FIGS. 3A to 3C.

FIG. 2C shows a concept where a line beam extending in a first direction (an x direction) scans a second direction (a y direction), in the measurement target 2000 corresponding to a chip. For example, the line beam may have a length of several to tens of millimeters (mm) in the first direction (the x direction) and may have a width of about 0.1 mm in the second direction (the y direction). Therefore, a field of view (FOV) by the line beam may have a size of several to tens of mm*0.1 mm. However, a size of the line beam and an FOV thereby are not limited to the numerical values.

The SI apparatus 1000 according to some embodiments may measure the measurement target 2000 through a scan operation of the line beam by using the line-scan SI optical system 200, and thus, may measure the measurement target 2000 at a high speed. For detailed example, a conventional measurement apparatus may have a spot size of tens μm*tens of μm and may measure a measurement target by using a point measurement method. Therefore, in order to obtain information about N (where N is an integer of 2 or more) points of a measurement target, N measurements by the conventional measurement apparatus may be needed, and thus, a time which is N times a time taken in one measurement may be expended. On the other hand, the SI apparatus 1000 according to some embodiments may measure an area of about several to tens of mm*several mm per one second by using the line-scan SI optical system 200. For example, the SI apparatus 1000 according to some embodiments may measure a 300 mm wafer for about 30 minutes by using the line-scan SI optical system 200.

Also, in the conventional measurement apparatus, about one to four pixels may correspond to a spot size. On the other hand, in the SI apparatus 1000 according to some embodiments, when the first detector 250 includes a camera having about hundreds to thousands*hundreds to thousands of pixels, information corresponding to hundreds to thousands of spots of the conventional measurement apparatus may be obtained with just one measurement. In more detail, for example, a spot size of the conventional measurement apparatus may correspond to about one pixel, and when the first detector 250 according to some embodiments includes a camera having 2048*2048 pixels, data corresponding to 2048 spots of the conventional measurement apparatus may be obtained through one measurement with respect to each of 2048 wavelengths. In the SI apparatus 1000 according to some embodiments, a pixel resolution of the first detector 250 of the line-scan SI optical system 200 may be less than or equal to several μm. For example, in a case where a camera having 2048*2048 pixels covers about 13 mm in a line direction, it may be considered that the camera has a pixel resolution of about 13 mm/2048≈6.34 μm pixels. A pixel resolution of the first detector 250 is not limited, however, to this example numerical value.

Figure 3A:
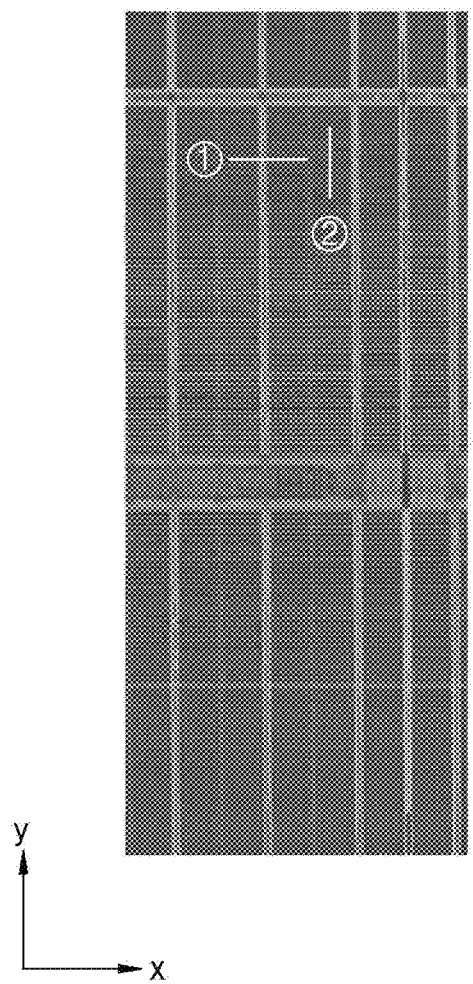
FIG. 3A is a conceptual diagram for showing an effect of a trigger system, in the line-scan SI optical system of FIG. 2A.
Figure 3B:
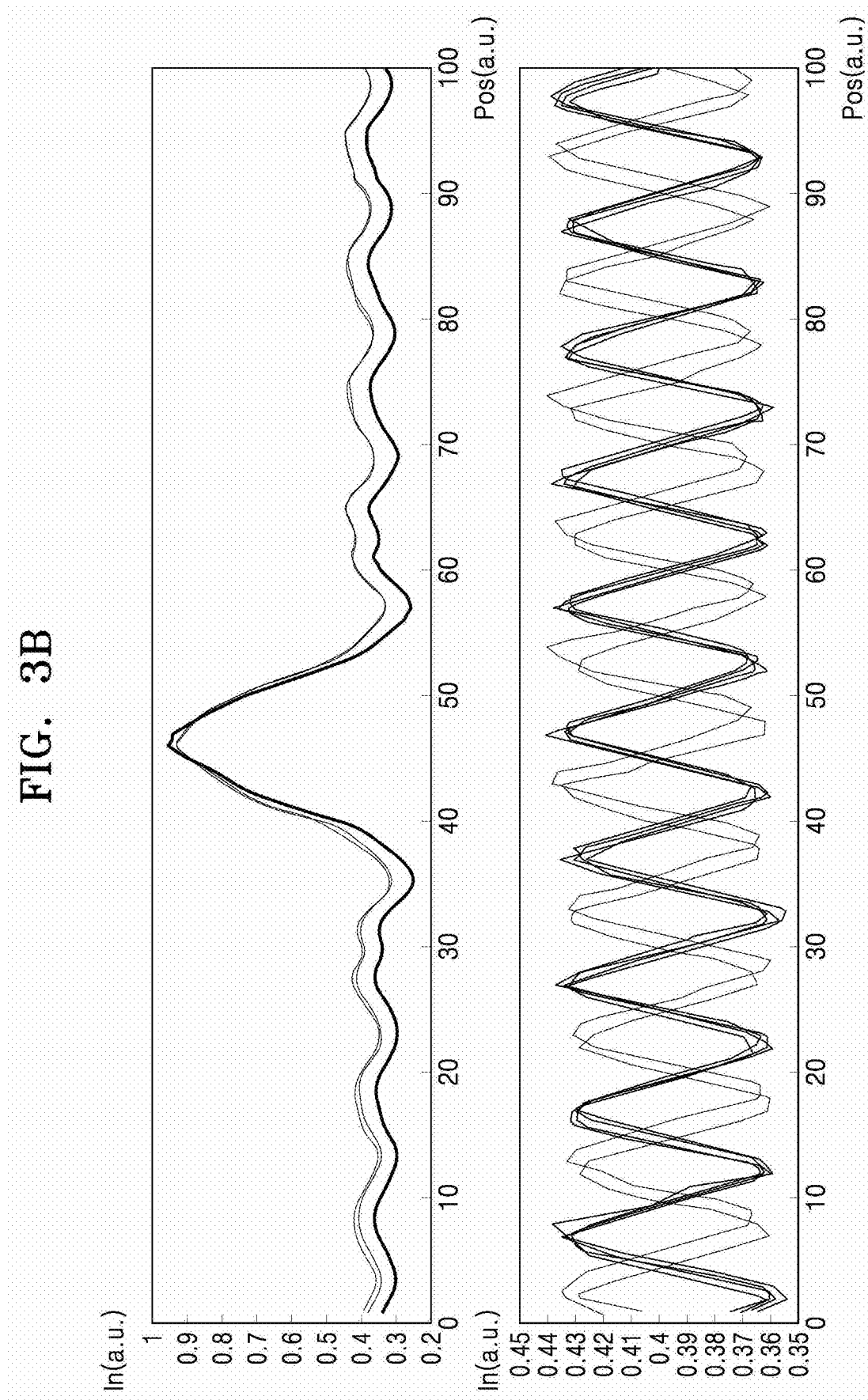
FIGS. 3B and 3C are graphs for showing the effect of the trigger system.
Figure 3C:
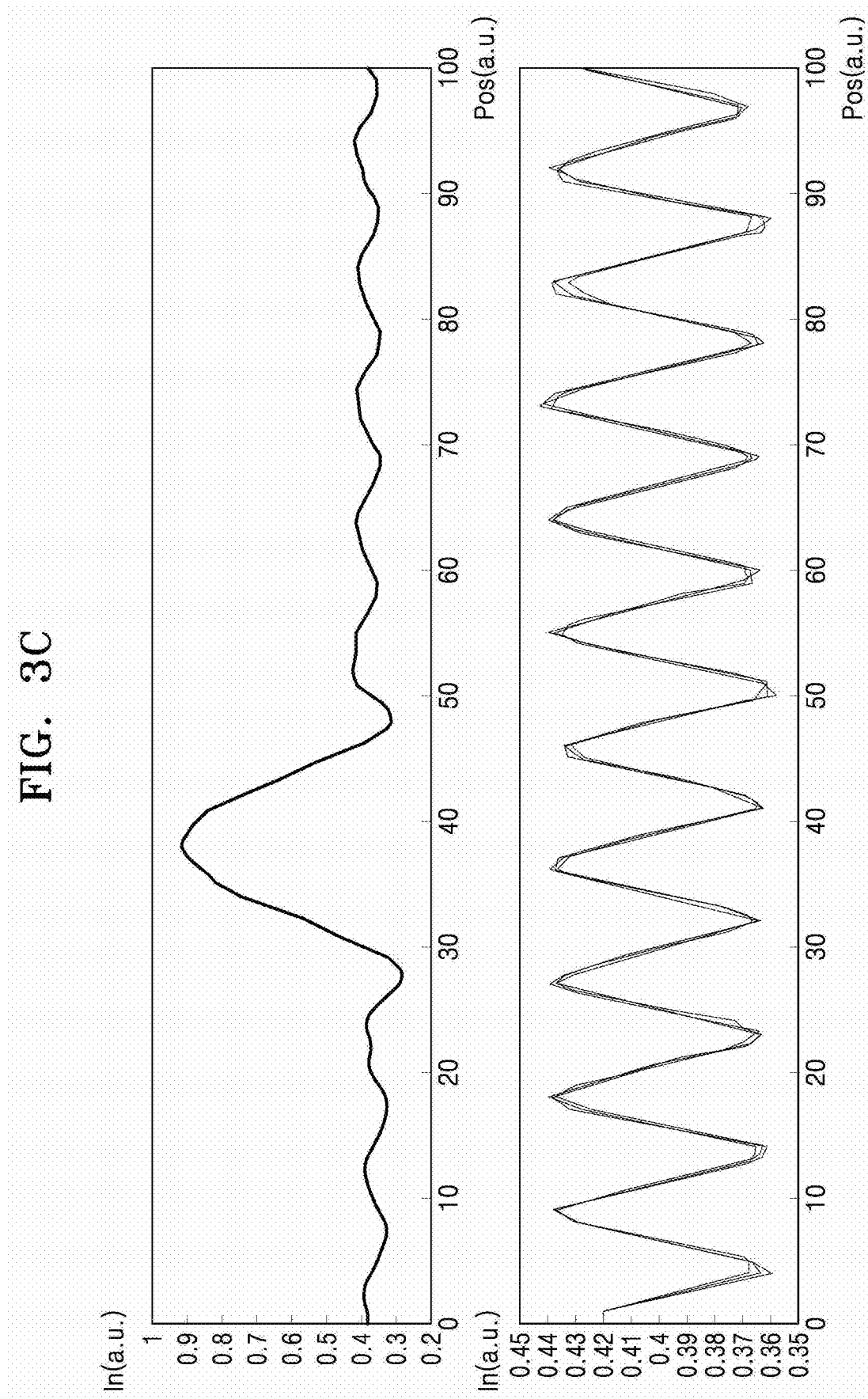

FIGS. 3A to 3C include a conceptual diagram and graphs of a chip for showing an effect of a trigger system, in the line-scan SI optical system 200 of FIG. 2A. FIG. 3A illustrates a chip which is a measurement target, FIG. 3B is a graph of intensity obtained through a line-scan SI optical system without a trigger system, and FIG. 3C is a graph of intensity obtained through a line-scan SI optical system including a trigger system. In the graphs of FIGS. 3B and 3C, an upper portion shows a graph representing a scan performed in a ① direction (an x direction), and a lower portion shows a graph representing a scan performed in a ② direction (a y direction). In each of the graphs, the x (horizontal) axis represents a position, the y (vertical) axis represents intensity, and each of the units is an arbitrary unit. This will be described below with reference to FIGS. 3A to 3C in conjunction with FIG. 1 or 2A.

Referring to FIGS. 3A to 3C, as seen in the upper graph and the lower graph of FIG. 3B, it may be seen that data of intensity of a line-scan image corresponding to the same portion of a chip is differently changed for each measurement. This may be because a time at which a measurement target moves is not synchronized with a time at which a camera captures an image, and due to this, a small difference occurs for each capture operation. On the other hand, as seen in the upper graph and the lower graph of FIG. 3C, it may be seen that data of intensity of a line-scan image corresponding to the same portion of a chip is constant regardless of each measurement. As a result, in the SI apparatus 1000 according to some embodiments, because the line-scan SI optical system 200 includes the trigger system 270, a line-scan image of the measurement target 2000 may be stably obtained.

FIG. 4 is a graph showing a result of measurement by the line-scan SI optical system 200 of FIG. 2A. A thick solid line represents a measurement result of a simulation, a thin solid line represents a measurement result obtained by a conventional measurement apparatus, and a dashed line represents a measurement result obtained by a line-scan SI optical system. The x/horizontal axis represents a wavelength and a unit is nm, and the y/vertical axis represents intensity and a unit is an arbitrary unit.

Referring to FIG. 4, as seen in the graph, it may be seen that a measurement result obtained by the line-scan SI optical system 200 of the SI apparatus 1000 according to some embodiments is substantially the same as a measurement result of a simulation or a measurement result obtained by a conventional measurement apparatus. Therefore, in the SI apparatus 1000 according to some embodiments, an accuracy of measurement by the line-scan SI optical system 200 may be confirmed. As a result, the line-scan SI optical system 200 of the SI apparatus 1000 according to some embodiments may maintain the same accuracy as that of the conventional measurement apparatus and may measure the measurement target 2000 at a speed, which is hundreds to thousands of times a speed of the conventional measurement apparatus.

Figure 5A:
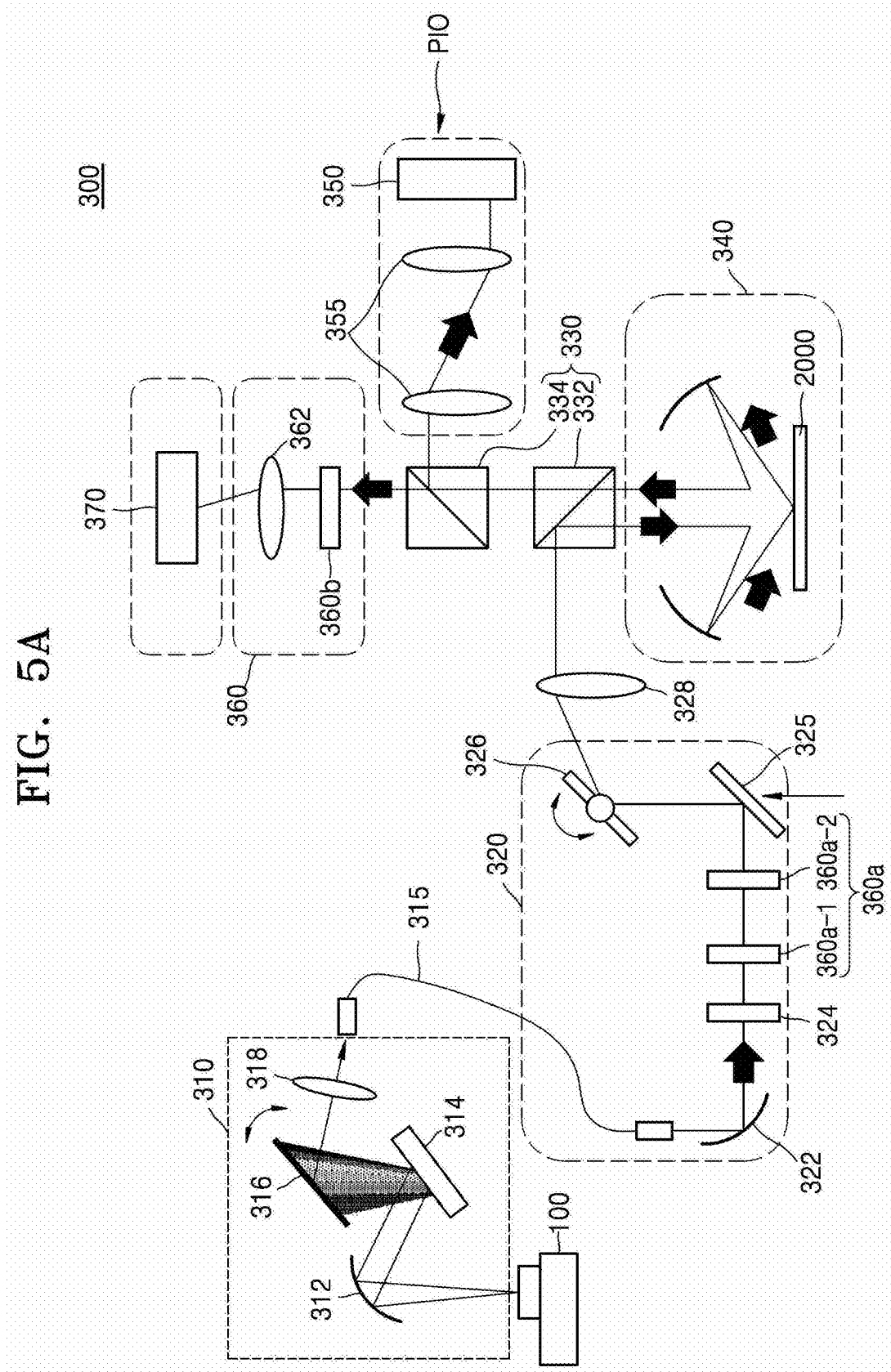
Figure 5C:
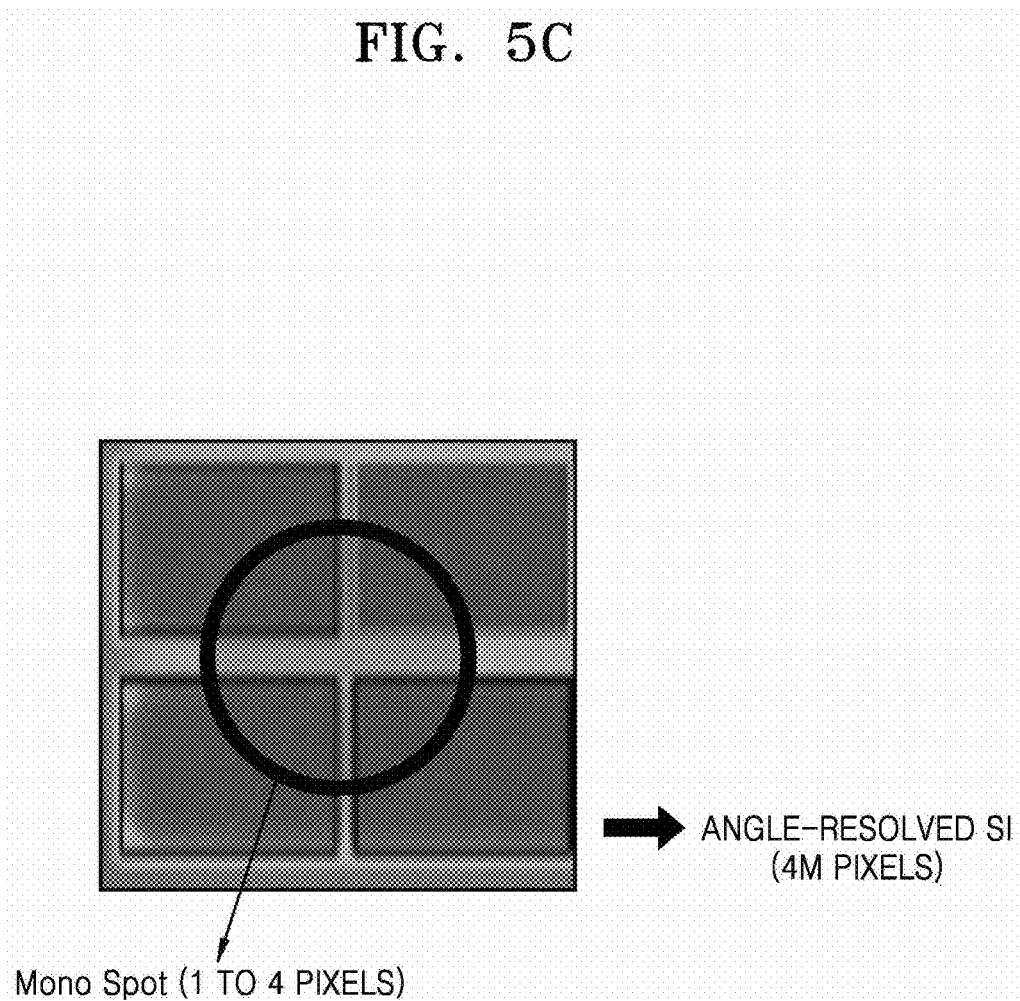
FIG. 5C is a conceptual diagram of the angle-resolved SI optical system, in the spectral imaging apparatus of FIG. 1.

FIG. 5A is a structure/schematic diagram of an angle-resolved SI optical system, in the SI apparatus 1000 of FIG. 1, FIG. 5B illustrates a simplified third detector and objective lens of an angle-resolved SI optical system, and FIG. 5C illustrates a high-resolution FOV. A description which is the same as or similar to description given above with reference to FIG. 1 may be briefly given below or omitted.

Referring to FIGS. 5A to 5C, in an SI apparatus 1000 according to some embodiments, the angle-resolved SI optical system 300 may include a high speed spectral module 310, an incident angle control module 320, a beam splitter unit 330, an objective lens 340, a second detector 350, an imaging optical system 360, and a third detector 370.

The high speed spectral module 310 may include a collimating mirror 312, a spectral device 314, a galvano mirror 316, and a relay lens 318. The collimating mirror 312 may include, for example, a spherical mirror and may shape light, supplied from a light source 100, into a parallel light shape. The spectral device 314 may divide light from the collimating mirror 312 and may irradiate the divided light to the galvano mirror 316. The spectral device 314 may be implemented as, for example, a diffraction grating. According to some embodiments, the spectral device 314 may be implemented as a prism. The galvano mirror 316, as illustrated by an arrow, may rotate, and thus, may irradiate light having a desired wavelength (i.e., desired monochromatic light) onto the relay lens 318. Here, the monochromatic light may denote, for example, light having a short-wavelength width of about several nm to tens of nm. The relay lens 318 may irradiate the monochromatic light, transferred from the galvano mirror 316, onto an optical fiber 315. The high speed spectral module 310 may include the galvano mirror 316, and thus, may select monochromatic light used/needed for the divided light at a high speed and may output the selected monochromatic light to the optical fiber 315. The high speed spectral module 310 including the galvano mirror 316 may be referred to as a high speed wavelength selector (HSWS) of a galvano type.

The incident angle control module 320 may include an off-axis parabolic mirror 322, a neutral density (ND) filter 324, a laser automatic focusing module mirror 325, and an inclined angle controller 326. The off-axis parabolic mirror 322 may transfer light, input from the optical fiber 315, to the ND filter 324 without distortion, and the ND filter 324 may make a density of the light uniform. Light from the ND filter 324 may pass through a polarization state generator 360a and may be incident on the laser automatic focusing module mirror 325. The laser automatic focusing module mirror 325 may correspond to a portion of a laser automatic focusing module. For reference, the laser automatic focusing module may perform a function of automatically controlling focusing of the objective lens 340 by using a laser. As illustrated by an arrow, a laser beam incident from a lower portion of the angle-resolved SI optical system 300 may pass through the laser automatic focusing module mirror 325 and may be incident on the inclined angle controller 326, and light incident through the polarization state generator 360a may be reflected by the laser automatic focusing module mirror 325 and may be incident on the inclined angle controller 326.

The inclined angle controller 326 may rotate as illustrated by an arrow, and thus, may change a position of light incident on a first beam splitter 332 via a scan lens 328 and may control a slope of light irradiated onto a measurement target 2000 by the objective lens 340. The principle of controlling a slope of light by using the inclined angle controller 326 will be described below in more detail with reference to FIG. 6. The scan lens 328 may scan light to the first beam splitter 332 on the basis of a rotation of the inclined angle controller 326. According to some embodiments, the scan lens 328 may be included in the incident angle control module 320. Also, the scan lens 328 may, in some embodiments, be omitted.

The inclined angle controller 326 may include, for example, a 2-axis steering mirror such as a galvano mirror. The inclined angle controller 326 in the incident angle control module 320 according to some embodiments is not limited to a mirror type such as the galvano mirror. For example, the inclined angle controller 326 may be implemented as a translation type or a wavefront control type such as digital micromirror device (DMD), spatial light module (SLM), or deformable mirror (DM). The mirror type may denote a type which changes a path of light reflected through a rotation to adjust a slope of light incident on the measurement target 2000, the wavefront type may denote a type which changes a shape of a wavefront to adjust an inclined angle of light, and the translation type may denote a type which linearly moves a mechanism outputting light to adjust an inclined angle of light.

As illustrated in FIG. 5A, the polarization state generator 360a may be disposed on the incident angle control module 320. The polarization state generator 360a may make incident light into light having a polarization state, for using a change of a signal based on polarization. That is, the polarization state generator 360a may allow incident light to have a polarization state suitable for a physical characteristic requiring measurement in the measurement target 2000. Here, the polarization state may include various polarization states such as a linear polarization state, a circular polarization state, and an elliptical polarization state. The polarization state generator 360a may include a rotation polarizer 360a-1 and a compensator 360a-2. According to some embodiments, the polarization state generator 360a may include only the rotation polarizer 360a-1. Alternatively, the polarization state generator 360a may be omitted.

A polarization state analyzer 360b may be disposed in the imaging optical system 360. The polarization state analyzer 360b may check a polarization state of light incident through a rotation analyzer. According to some embodiments, the polarization state analyzer 360b may include a rotation analyzer and a compensator. Generally, the polarization state generator 360a and the polarization state analyzer 360b may be paired and may operate collaboratively. Therefore, when the polarization state generator 360a is omitted, the polarization state analyzer 360b may also be omitted.

In addition, in the line-scan SI optical system 200, the rotation polarizer 260a may correspond to a polarization state generator, and the rotation analyzer 260b may correspond to a polarization state analyzer. Therefore, when the rotation polarizer 260a is omitted, the rotation analyzer 260b may be omitted. Also, in the line-scan SI optical system 200, a compensator corresponding to each of the rotation polarizer 260a and the rotation analyzer 260b may be additionally disposed therein.

The beam splitter unit 330 may include a first beam splitter 332 and a second beam splitter 334. The first beam splitter 332 may irradiate light, which is incident through the scan lens 328, onto the objective lens 340 and may irradiate light, which is reflected by a measurement target 2000 and is incident thereon via the objective lens 340, onto the second beam splitter 334. The second beam splitter 334 may irradiate a portion of light, input from the first beam splitter 332, onto the second detector 350 and may irradiate another portion of the light onto the imaging optical system 360.

The objective lens 340 may include a reflective objective lens having a high magnification or a high numerical aperture (NA). For example, the objective lens 340 may have tens to hundreds of times magnification. The angle-resolved SI optical system 300 according to some embodiments may slopingly irradiate light onto a top surface of the measurement target 2000 at an acute angle by using the objective lens 340 of a reflective type. Also, the incident angle control module 320 may adjust a focus position of light on a pupil surface of the objective lens 340 to adjust an inclined angle of light incident on the measurement target 2000. A structure of the objective lens 340 and an operation of adjusting an inclined angle of the objective lens 340 will be described below in more detail with reference to FIG. 6.

The second detector 350 may detect light, reflected by the measurement target 2000, on a pupil surface. The second detector 350 may directly detect an image (i.e., a pupil image) of the pupil surface, and thus, separate condensing lenses for condensing light may not be needed. However, as illustrated, a relay mirror 355 may be disposed between the second beam splitter 334 and the second detector 350. The relay mirror 355 and the second detector 350 may collectively provide a pupil image optical system (PIO). According to some embodiments, the relay mirror 355 may be omitted, and the PIO may comprise only the second detector 350.

The second detector 350 may detect light on the pupil surface, and thus, may be favorable to measurement of accurate intensity of light. Therefore, the second detector 350 may be used to monitor a state of the angle-resolved SI optical system 300. The second detector 350 may include, for example, a charge-coupled device (CCD) or a photomultiplier tube (PMT). However, the second detector 350 is not limited to the above-described devices.

The imaging optical system 360 may transfer light, input from the second beam splitter 334, to the third detector 370 without distortion. Also, the imaging optical system 360 may collect light and may image the collected light on an imaging surface of the third detector 370. The imaging optical system 360 may include, for example, a tube lens 362.

The third detector 370 may detect light, reflected by the measurement target 2000, on the imaging surface of the third detector 370. The third detector 370, as illustrated in FIG. 5B, may detect a 2D array image. Here, the 2D array image may denote a 2D image corresponding to monochromatic light. The third detector 370 may correspond to a camera for measuring the measurement target 2000, in the angle-resolved SI optical system 300.

According to some embodiments, the high speed spectral module 310 may be disposed between the objective lens 340 and the third detector 370. However, in a case where the high speed spectral module 310 is disposed at the above-mentioned position, most of optical devices configuring the angle-resolved SI optical system 300 may be implemented with a mirror instead of a lens, for limiting/minimizing aberration caused by a wavelength.

In FIG. 5C, in the angle-resolved SI optical system 300, when the objective lens 340 has 100 times magnification, an FOV may correspond to about four times a spot size of a conventional measurement apparatus. For example, the spot size of the conventional measurement apparatus may be about 30 μm*30 μm, and an FOV in the angle-resolved SI optical system 300 may be about 65 μm*65 μm and thus may correspond to almost four times the spot size of the conventional measurement apparatus. In a case where the third detector 370 includes a camera having 2048*2048 pixels, the third detector 370 may have a pixel resolution of about 65 μm/2048≈31.7 nm. On the other hand, an FOV of 65 μm*65 μm may correspond to 4,000,000 or more pixels. Therefore, one to four pixels of the third detector 370 corresponding to the spot size of the conventional measurement apparatus may correspond to one-thousandths to tens of thousandths of an area based on the conventional measurement apparatus. As a result, information obtained by equally dividing one spot into thousands to tens of thousands of portions may be obtained by performing one measurement on an FOV by using the angle-resolved SI optical system 300 according to some embodiments. For example, by using the angle-resolved SI optical system 300, the SI apparatus 1000 according to some embodiments may have an effect where a point corresponding to the spot size of the conventional measurement apparatus is divided into 4,000,000 pixels and measurement is performed.

Figure 6:
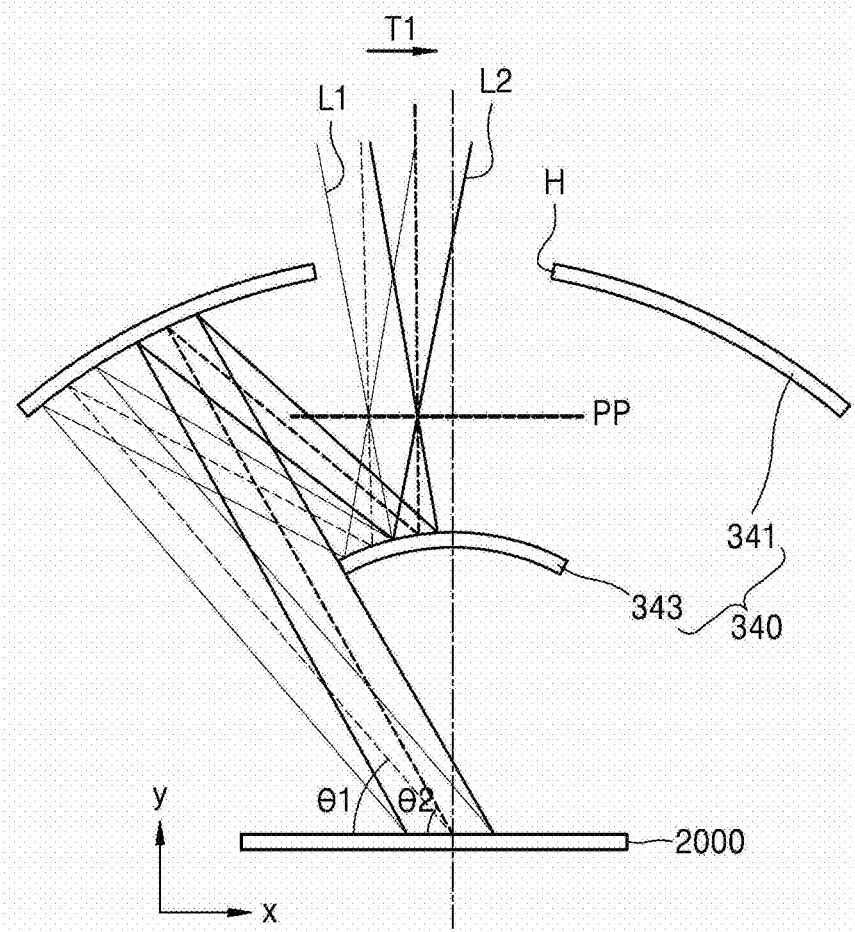
FIG. 6 is a conceptual diagram for describing the principle of adjusting a slope of light incident on a measurement target, in a reflective objective lens of the angle-resolved SI optical system of FIG. 5A.

FIG. 6 is a conceptual diagram for describing the principle of adjusting a slope of light incident on a measurement target, in the reflective objective lens 340 of the angle-resolved SI optical system 300 of FIG. 5A. The principle will be described below with reference to FIG. 6 in conjunction with FIG. 5A, and description which is the same as or similar to description given above with reference to FIG. 5A may be briefly given below or omitted.

Referring to FIG. 6, in an SI apparatus 1000 according to some embodiments, an angle-resolved SI optical system 300 may include a reflective objective lens 340. The reflective objective lens 340 may include a main mirror 341 of an aspherical mirror type and a secondary mirror 343 of an aspherical mirror type. An open hole H may be formed in a center of the main mirror 341, and pieces/fragments of light (for example, first light and second light) L1 and L2 from the first beam splitter 332 may be incident on the reflective objective lens 340 through the open hole H.

As illustrated in FIG. 6, the pieces/fragments of light L1 and L2 from the first beam splitter 332 may be incident through the open hole H, and moreover, may be reflected by the secondary mirror 343 and the main mirror 341 and may be slopingly incident on the measurement target 2000. In more detail, the first light L1, which is illustrated by a thin solid line and is from the first beam splitter 332, may focus on a pupil surface PP via the open hole H, may be reflected by the secondary mirror 343 and may be incident on the main mirror 341, and may be reflected by the main mirror 341 and may be slopingly incident on the measurement target 2000 at a first inclined angle θ1. Also, the second light L2, which is illustrated by a thick solid line and is from the first beam splitter 332, may focus on the pupil surface PP via the open hole H, may be reflected by the secondary mirror 343 and may be incident on the main mirror 341, and may be reflected by the main mirror 341 and may be slopingly incident on the measurement target 2000 at a second inclined angle θ2. Here, the thin dotted line may correspond to an optical axis of the first light L1, and the thick dotted line may correspond to an optical axis of the second light L2.

As seen by an arrow T1 of FIG. 6, the second light L2 may be light which has linearly moved in a first direction (an x direction), and based on the linear movement of light, inclined angles of pieces/fragments of light incident on the measurement target 2000 may be changed. For example, the first inclined angle θ1 may be less than the second inclined angle θ2. The linear movement of light may be performed by various types of optical devices in the incident angle control module 320.

FIGS. 7A and 7B are conceptual diagrams for describing the principle that measurement sensitivity increases based on the sloped irradiation of light by an objective lens.

Referring to FIGS. 7A and 7B, light reflected by a measurement target 2000 may be diffracted by a pattern of the measurement target 2000. That is, light (i.e., diffracted light) diffracted through reflection by the measurement target 2000 may include pieces/fragments of higher-order light as well as zero-order light at a center. However, the SI apparatus 1000 according to some embodiments may be used to mainly measure zero-order light and $1^{st}$-order light, and thus, in FIGS. 7A and 7B, for convenience, only zero-order light (0) and $1^{st}$-order light (−1, +1) are illustrated. However, a case where the SI apparatus 1000 according to some embodiments uses $2^{nd}$ or higher-order light for measurement may not completely be excluded. Hereinafter, diffracted light will be described with reference to only zero-order light and $1^{st}$-order light (−1, +1). In $1^{st}$-order light (−1, +1), a diffracted angle (i.e., a diffraction angle) may vary based on a size or a pitch of a pattern of the measurement target 2000. For example, when a pitch of a pattern is reduced, a diffraction angle of $1^{st}$-order light (−1, +1) may increase relatively.

As in FIG. 7A, in a case where light is vertically incident on the measurement target 2000, and a size and a pitch of a pattern of the measurement target are small, as illustrated by a dashed line, a diffraction angle of $1^{st}$-order light (−1, +1) may be greater than an NA of an objective lens 340a, and thus, only zero-order light (0), illustrated by a solid line, of reflected pieces/fragments of diffracted light may be incident on a detector via the objective lens 340a and an aperture AP. Therefore, a resolution of an image obtained from the detector may be low, or it may be unable to measure diffracted light.

On the other hand, as in FIG. 7B, in a case where light is incident on a measurement target 2000, even when a size and a pitch of a pattern of the measurement target 2000 are small, zero-order light (0) and a portion (for example, $-1^{st}$-order light (−1)) of 1st-order light (−1, +1) may be incident on a detector via an objective lens 340a and an aperture AP. Therefore, a resolution of the image obtained from the detector may be considerably enhanced. Although it depends on an NA of an objective lens, due to an increase in resolution, slopingly irradiated lighting may theoretically increase measurement sensitivity by maximum twice as compared to vertically irradiated lighting. In FIGS. 7A and 7B, for convenience of description, the objective lens 340a is illustrated as a transmissive type instead of a reflective type, but the same principle may also be applied to a reflective objective lens.

Figure 8A:
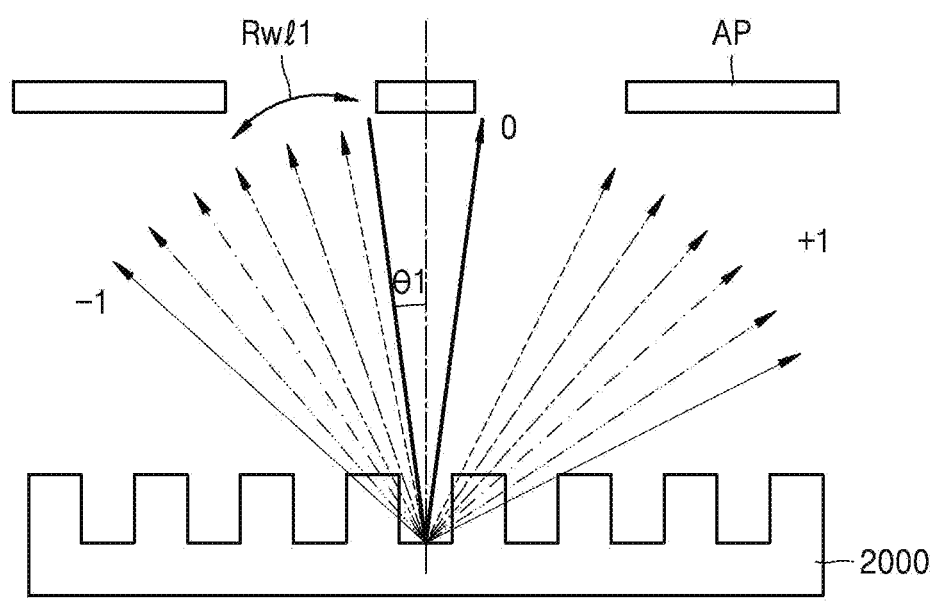
FIGS. 8A and 8B are conceptual diagrams for describing a concept of adjusting a slope of light incident on a measurement target to enlarge an available wavelength region.
Figure 8B:
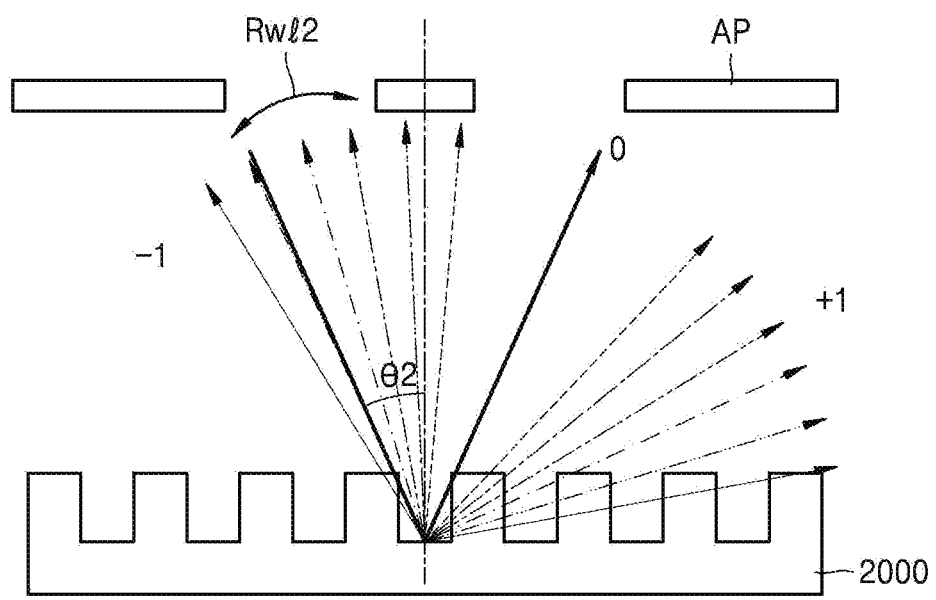

FIGS. 8A and 8B are conceptual diagrams for describing a concept of adjusting a slope of light incident on a measurement target to enlarge an available wavelength region.

Referring to FIGS. 8A and 8B, a process may be diversified and a scale of a measurement target for each process may be diversified, and thus, light of various wavelength regions may be needed for each process. In the SI apparatus 1000 according to some embodiments, the angle-resolved SI optical system 300 may adjust a slope of light incident on the measurement target 2000 to change or enlarge a wavelength region of available light, and thus, may flexibly respond to the need for various wavelength regions for each process.

In more detail, as in FIG. 8A, when an incident angle of light incident on the measurement target 2000 has a first inclined angle θ1, which is relatively small, as illustrated by a bidirectional curve arrow, light of a first wavelength region Rwl1 may be used, and light outside the first wavelength region Rwl1 may not be used because a diffraction angle of diffracted light is large. For example, in a case of visible light, green light, blue light, and violet light each having a short wavelength in the first inclined angle θ1 may be used for measurement because a diffraction angle of $1^{st}$-order light is small, but yellow light, orange light, and red light each having a long wavelength may not be used for measurement because a diffraction angle of $1^{st}$-order light is large.

On the other hand, as in FIG. 8B, when an incident angle has a second inclined angle θ2, which is relatively large, as illustrated by a curve arrow, light of a second wavelength region Rwl2 may be used, and light outside the second wavelength region Rwl2 may not be used because a diffraction angle of diffracted light is too large or too small. For example, in a case of visible light, orange light, yellow light, and green light each having a middle wavelength in the second inclined angle θ2 may be used for measurement because a diffraction angle of $1^{st}$-order light is suitable, but red light having a very long wavelength or blue or violet light having a very short wavelength may not be used for measurement because a diffraction angle of $1^{st}$-order light is too large or too small.

As a result, by adjusting a slope of light incident on the measurement target 2000, a wavelength region of light usable for measurement may be changed or enlarged. For reference, the movement of a wavelength region from FIG. 8A to FIG. 8B may correspond to a change of the wavelength region. However, based on a structure of the reflective objective lens 340, a wavelength region may move so that light having a short wavelength like blue light or violet light is used and light having a long wavelength is additionally used, and such a case may correspond to the enlargement of a wavelength region. Also, comparing with a case where a slope of light incident on the measurement target 2000 is fixed, measurement sensitivity may be enhanced by 1.4 times, based on the adjustment of an inclined angle.

Figure 9A:
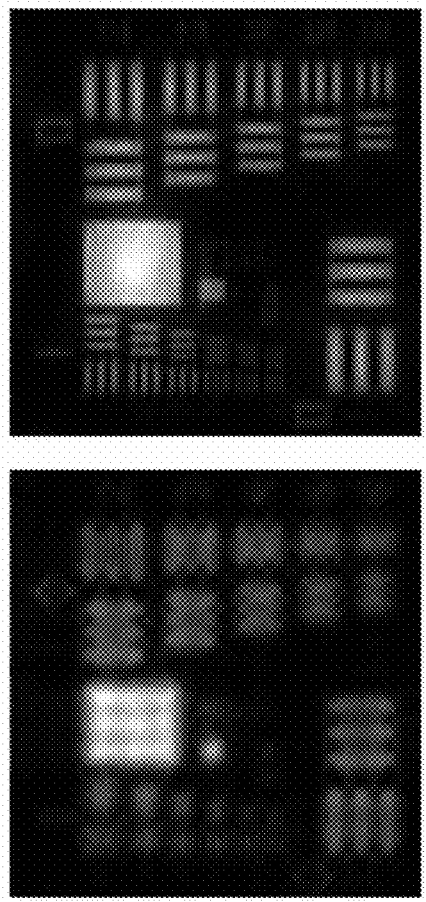
FIGS. 9A and 9B are simulation graphs showing sensitivity with respect to an incident angle and a photograph image obtained on the basis of the application or not of the angle-resolved SI optical system of FIG. 5A.
Figure 9B:
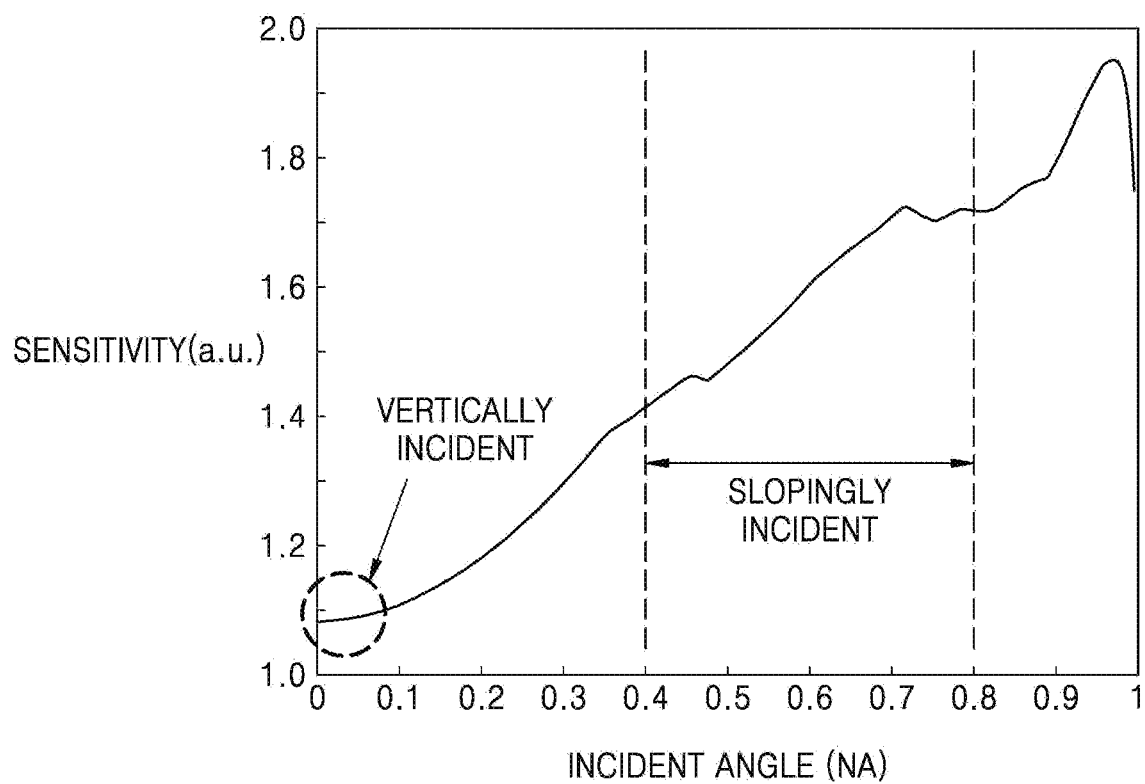

FIGS. 9A and 9B are simulation graphs showing sensitivity with respect to an incident angle and a photograph image obtained on the basis of the application or not of the angle-resolved SI optical system of FIG. 5A. In FIG. 9A, the left region shows a photograph image obtained without applying an angle-resolved SI optical system, and the right region shows a photograph image obtained by applying the angle-resolved SI optical system. In the graph of FIG. 9B, the x/horizontal axis represents an incident angle and a unit is an NA, and the y/vertical axis represents sensitivity and a unit is an arbitrary unit.

Referring to FIG. 9A, it may be seen that an image (i.e., a result obtained by synthesizing images obtained through light which is slopingly incident at a plurality of angles and in a plurality of directions), corresponding to a case where an angle-resolved SI optical system is applied, is much clearer than an image (i.e., an image obtained through light which is slopingly incident at a fixed angle) corresponding to a case where the angle-resolved SI optical system is not applied. Therefore, it may be seen that a high-resolution image is obtained by selecting and synthesizing incident angles optimized by applying the angle-resolved SI optical system. Also, a resolution may be optimized by appropriately adjusting a slope with respect to a wavelength used for the angle-resolved SI optical system.

Referring to FIG. 9B, the dashed-line circle may correspond to a case which uses light which is vertically incident, and it may be seen that sensitivity is very low. On the other hand, like a portion illustrated by a bidirectional arrow, it may be seen that sensitivity largely increases in a case which uses slopingly incident light. Also, sensitivity may increase at a portion where an incident angle is 0.8 or more, but the incident angle may correspond to an incident angle which is actually unusable in terms of a structure of an objective lens. An incident angle having highest sensitivity may vary based on the kind of a specimen.

As a result, by using the angle-resolved SI optical system 300, the SI apparatus 1000 according to some embodiments may slopingly irradiate light onto the measurement target 2000 to perform measurement, thereby enhancing a resolution and maintaining or enhancing sensitivity. For reference, generally, there is a trade-off relationship between a resolution and sensitivity, which decreases the sensitivity when the resolution increases. However, the SI apparatus 1000 according to some embodiments may enhance a resolution and maintain or enhance sensitivity, thereby solving a trade-off problem between the sensitivity and resolution of a conventional measurement apparatus.

Figure 10A:
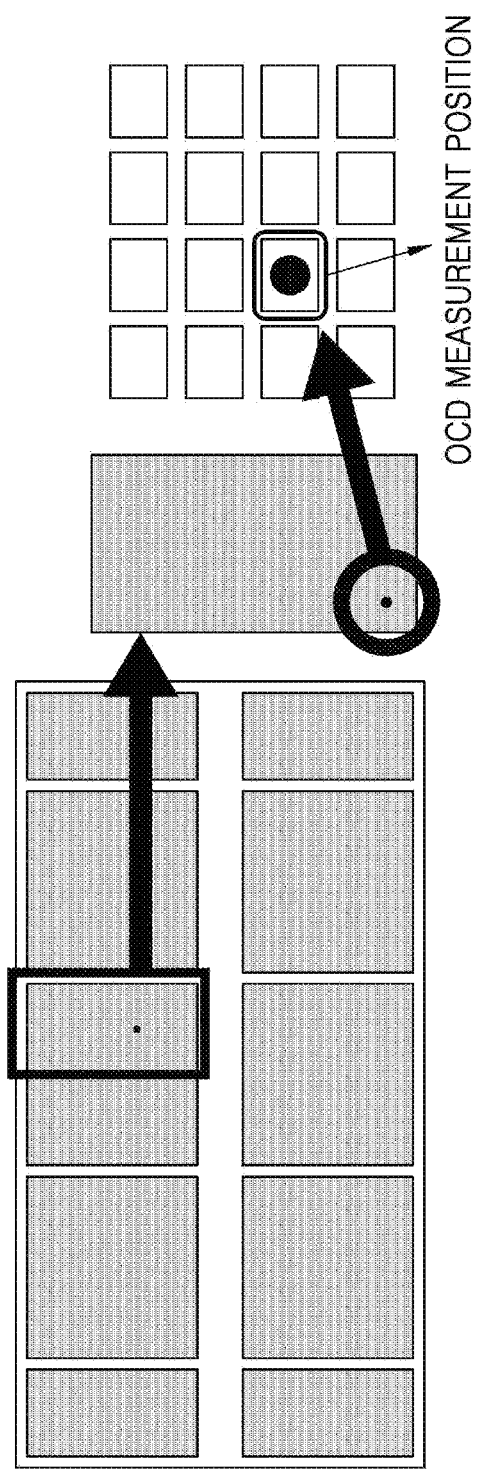
FIGS. 10A and 10B are conceptual diagrams for describing advantages of measurement by the spectral imaging apparatus of FIG. 1.
Figure 10B:
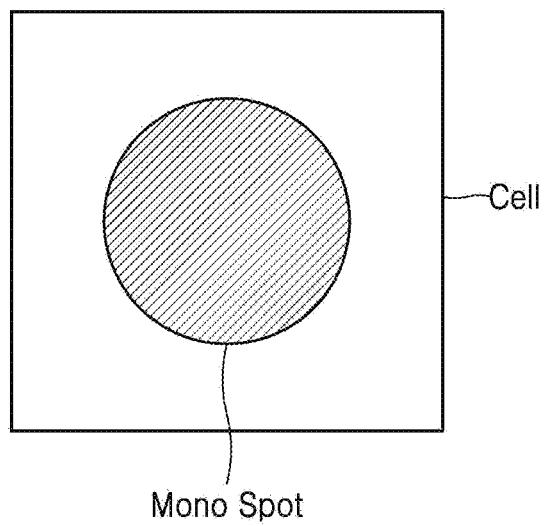

FIGS. 10A and 10B are conceptual diagrams for describing advantages of measurement by the spectral imaging apparatus of FIG. 1. In FIG. 10A, a chip, a bank, and cells may be arranged in this stated order from the left. FIG. 10B may correspond to one cell. The following description will be given below with reference to FIGS. 10A and 10B in conjunction with FIG. 1.

Referring to FIG. 10A, a dark dot in each of a chip, bank, and cells may correspond to a spot of a conventional measurement apparatus. Therefore, in the conventional measurement apparatus, only data of one cell may be obtained in performing measurement once. In a case which measures several portions, a measurement time may linearly increase based on the number of measurements. Therefore, in the conventional measurement apparatus, due to an insufficient time, it may be unable to perform measurement on all of the chip, and thus, the conventional measurement apparatus may not respond to the needs for checking an internal distribution of the chip. On the other hand, by using the line-scan SI optical system 200, the SI apparatus 1000 according to some embodiments may measure all of the chip at a high speed, and thus, may effectively respond to the needs for checking an internal distribution of the chip.

Referring to FIG. 10B, a tetragonal portion may correspond to one cell, and a circular portion may correspond to a spot of the conventional measurement apparatus. For example, a cell may be about 50 μm in each of width and length, and a diameter of the spot of the conventional measurement apparatus may be about 30 μm. Considering the spot of the conventional measurement apparatus, an inner portion of a cell may be measured once, and moreover, data corresponding to an average value of the inner portion of the cell may be obtained in one measurement. Therefore, it may be unable to perform measurement on an internal locality of a cell, and it may be unable to respond to the needs for checking an internal distribution of the cell. On the other hand, by using the angle-resolved SI optical system 300, the SI apparatus 1000 according to some embodiments may equally divide a cell into thousands to tens of thousands portions and may perform measurement, based on one FOV measurement covering one cell. Therefore, the SI apparatus 1000 according to some embodiments may precisely measure an internal locality or uniformity of a cell, and thus, may effectively respond to the needs for checking an internal distribution of the cell.

Figure 11:
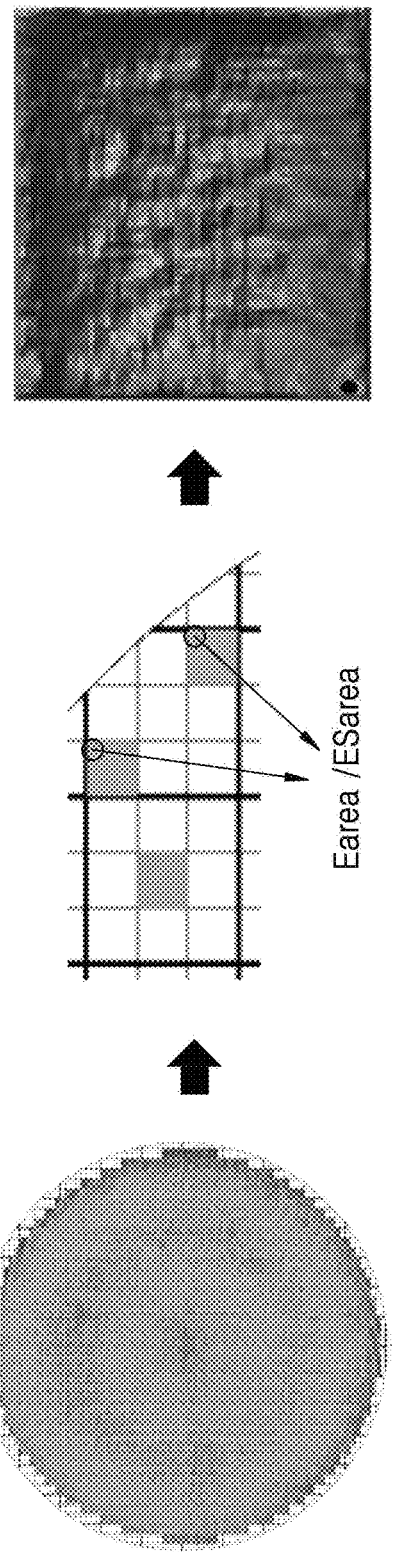
FIG. 11 shows simulation photographs for describing a multi-scale measurement operation of the spectral imaging apparatus of FIG. 1.

FIG. 11 shows simulation photographs for describing a multi-scale measurement operation of the spectral imaging apparatus of FIG. 1. In FIG. 11, the left photograph may be a simulation photograph of a wafer obtained through the line-scan SI optical system 200, the middle photograph may be a photograph showing the enlargement of a certain portion of the left photograph, and the right photograph may be a simulation photograph of one cell which includes an error/error-suspicious area and is obtained through the angle-resolved SI optical system 300.

Referring to FIG. 11, first, the SI apparatus 1000 according to some embodiments may perform measurement on the measurement target 2000 (for example, a wafer) having a large area by using the line-scan SI optical system 200. The measurement target 2000 having a large area may not be limited to all of a wafer and may be a portion corresponding to one shot of the wafer or a portion corresponding to a chip. By using the line-scan SI optical system 200, measurement may be performed on all (i.e., a whole/an entirety) of the measurement target 2000 at a high speed on the basis of a relatively low resolution (for example, a pixel resolution of about several μm).

Subsequently, an error area Earea or an error-suspicious area ESarea may be mined from a high-speed measurement result of a large area obtained through the line-scan SI optical system 200. In other words, areas outside a predetermined criterion may be selected from the high-speed measurement result of a large area. Here, the predetermined criterion may be, for example, a predetermined reference intensity for the measurement target 2000. For example, each of a plurality of small circles in the middle photograph may be an error/error-suspicious area Earea/ESarea. Also, in the middle photograph, each of tetragonal portions may correspond to a cell, and for convenience, intensity information about only three of all of the cells illustrated is hatched.

After the error/error-suspicious area Earea/ESarea is mined, a corresponding region may be precisely measured by using the angle-resolved SI optical system 300. In the right photograph, in a case where a size of one cell is about 50 μm*50 μm, one cell may be included in an FOV of the angle-resolved SI optical system 300. Also, when a pixel resolution of the third detector 370 is tens of nm, one cell may be precisely measured by millions of pixels. Therefore, a cause of an error and the kind of the error may be accurately checked by independently obtaining spectrum information (for example, wavelength-based intensity information) for each of a plurality of internal positions of a cell.

As a result, the SI apparatus 1000 according to some embodiments may include the line-scan SI optical system 200 and the angle-resolved SI optical system 300, and thus, may perform multi-scale measurement (i.e., high-speed measurement on the measurement target 2000 having a large area) and high-resolution measurement on a small region corresponding to the error/error-suspicious area Earea/ESarea. Therefore, the SI apparatus 1000 according to some embodiments may perform precise measurement on a small region while measuring all of the measurement target 2000 at a high speed. Also, the line-scan SI optical system 200 and the angle-resolved SI optical system 300 may share the stage 400, and thus, the SI apparatus 1000 according to some embodiments may solve a problem of coordinates precision between the line-scan SI optical system 200 and the angle-resolved SI optical system 300 and a problem of time delay in a process which needs measurement for a limited time.

Figure 12A:
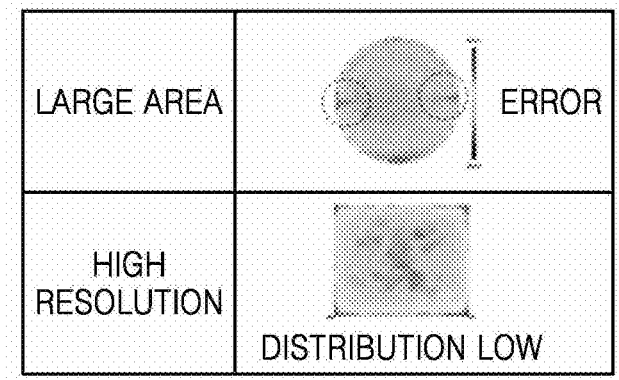
FIGS. 12A to 12C are simulation photographs showing effects based on a multi-scale measurement operation of the spectral imaging apparatus of FIG. 1.
Figure 12B:
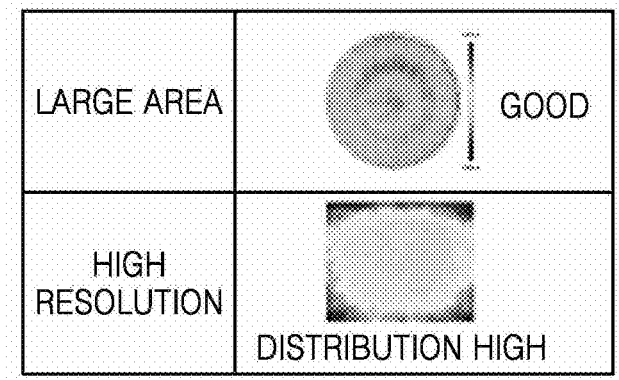
Figure 12C:
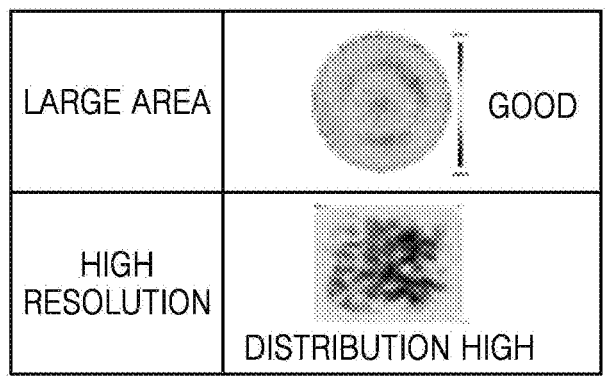

FIGS. 12A to 12C are simulation photographs showing effects based on a multi-scale measurement operation of the spectral imaging apparatus of FIG. 1. In each of FIGS. 12A to 12C, the upper photograph may be a simulation photograph of a wafer obtained based on the line-scan SI optical system 200, and the lower photograph may be a photograph of a cell obtained based on the angle-resolved SI optical system 300. Also, FIG. 12A relates to a wafer manufactured based on an initial process condition, and FIGS. 12B and 12C relate to wafers manufactured based on a changed process condition.

Referring to FIGS. 12A to 12C, in FIG. 12A, in a simulation photograph of a wafer obtained based on the line-scan SI optical system 200, an error portion illustrated as a dashed-line circle at both portions may be confirmed. However, in the simulation photograph based on the angle-resolved SI optical system 300, an internal distribution of a cell may be low, and thus, a relatively good state may be confirmed. Here, the cell may be a cell included in the error portion In FIGS. 12B and 12C, it may be confirmed that an error portion is removed from each of simulation photographs based on the line-scan SI optical system 200 by changing a process condition. However, in simulation photographs based on the angle-resolved SI optical system 300, it may be confirmed that an internal distribution of a cell increases to be high. Therefore, it may be seen that additional changing of a process condition is needed for decreasing an internal distribution of a cell.

For example, in a case where only high-resolution measurement is performed on the measurement target 2000, an error state of a certain portion of the measurement target 2000 may not be checked unlike a result of FIG. 12A. Also, in a case where only large-area measurement is performed on the measurement target 2000, a distribution error of a cell may not be checked unlike results of FIGS. 12B and 12C. On the other hand, the SI apparatus 1000 according to some embodiments may perform multi-scale measurement on the measurement target 2000, thereby solving a problem described above.

Figure 13:
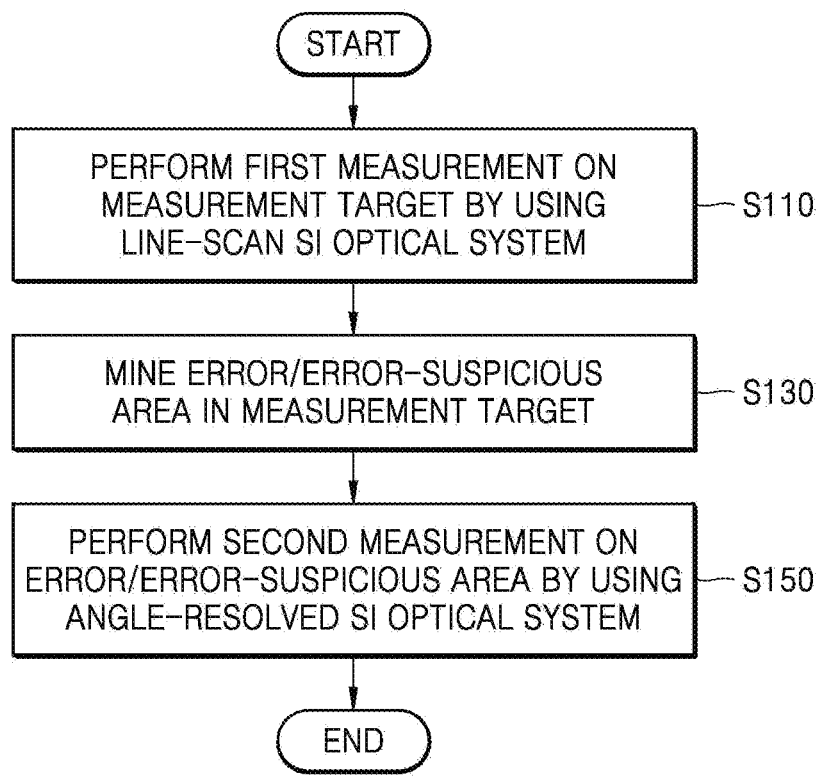
FIG. 13 is a flowchart illustrating a multi-scale spectral imaging method according to an embodiment.

FIG. 13 is a flowchart illustrating a multi-scale spectral imaging method according to an embodiment. The following description will be given below with reference to FIG. 13 in conjunction with FIG. 1.

Referring to FIG. 13, first, the multi-scale spectral imaging method (hereinafter simply referred to as an SI method) according to some embodiments may perform a first measurement on the measurement target 2000 having a large area at a high speed by using the line-scan SI optical system 200 of the SI apparatus 1000 in operation S110. For example, by using the line-scan SI optical system 200 having a pixel resolution of tens of μm, the SI apparatus 1000 may measure an area of about several to tens of mm*several mm per one second, and thus, may measure a 300 mm wafer for about 30 minutes.

Subsequently, in operation S130, an error/error-suspicious area may be selected/mined from the measurement target 2000 on the basis of a result of the first measurement. The mining of the error/error-suspicious area, for example, may be performed by selecting regions outside a certain criterion in a measurement result.

After the error/error-suspicious area is mined, a second measurement may be performed on the error/error-suspicious area on the basis of a high resolution by using the angle-resolved SI optical system 300 of the SI apparatus 1000 in operation S150. For example, by using the angle-resolved SI optical system 300, a corresponding cell including the error/error-suspicious area may be precisely measured based on a high resolution, and thus, an internal locality or uniformity of the cell may be measured and a cause of an error and the kind of the error may be checked. In detail, by using the angle-resolved SI optical system 300, the SI apparatus 1000 according to some embodiments may divide a point, corresponding to a spot size of the conventional measurement apparatus, into millions of pixels and may perform measurement. Therefore, an internal locality or uniformity of the cell may be precisely measured, and moreover, the cause and kind of an error may be checked in detail.

Figure 14:
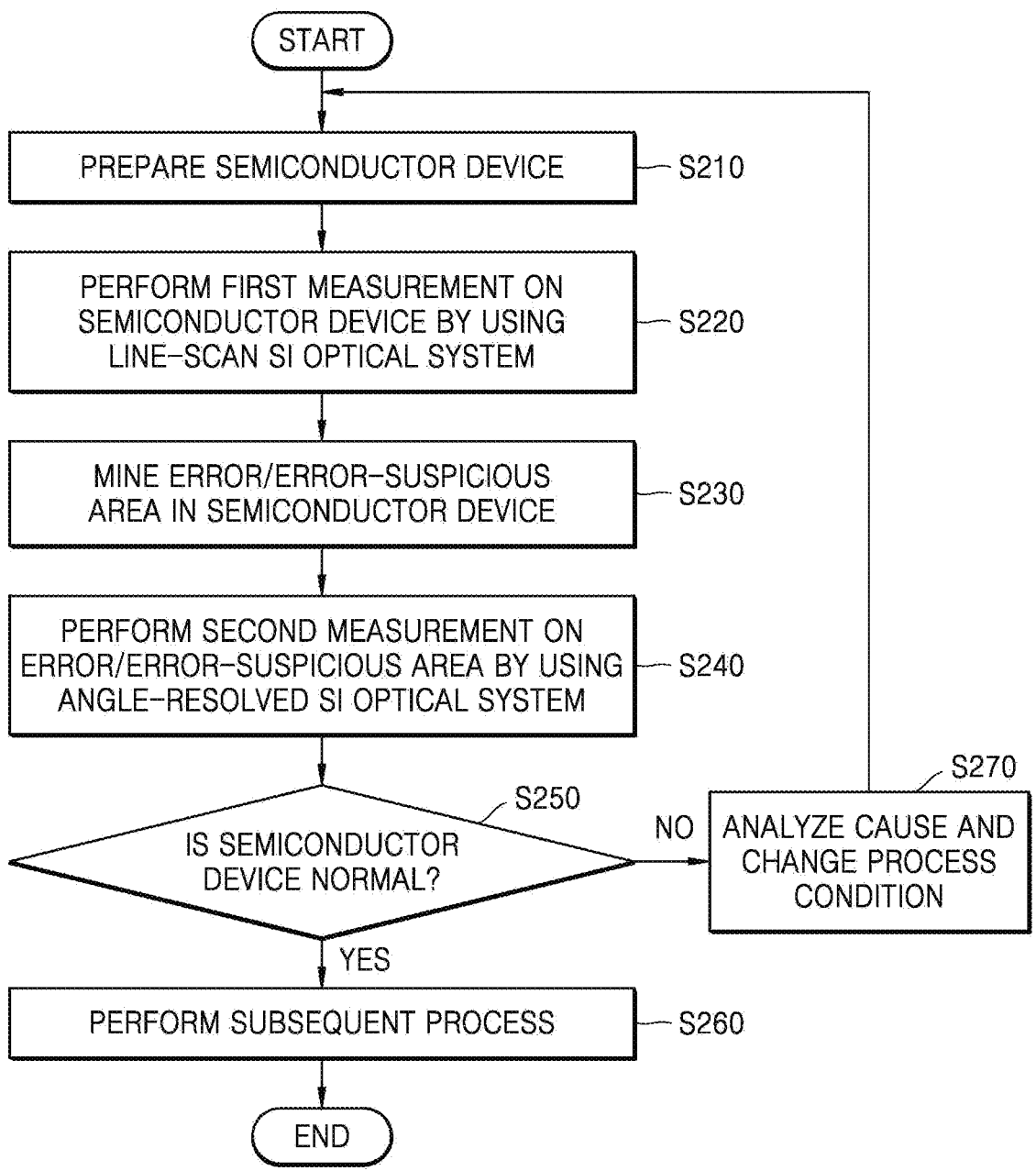
FIG. 14 is a flowchart illustrating a method of manufacturing a semiconductor device by using a spectral imaging method, according to an embodiment.

FIG. 14 is a flowchart illustrating a method of manufacturing a semiconductor device by using a spectral imaging method, according to an embodiment. The following description will be given below with reference to FIG. 14 in conjunction with FIG. 1, and description which is the same as or similar to description given above with reference to FIG. 13 may be briefly given below or omitted.

Referring to FIG. 14, first, a method of manufacturing a semiconductor device (hereinafter simply referred to as a manufacturing method) by using the SI method according to some embodiments may prepare a semiconductor device which is/includes a measurement target in operation S210. The semiconductor device, for example, may be a mask or a wafer or a portion corresponding to a shot of the wafer or a chip. The semiconductor device is not limited to the devices described above. A process of preparing the semiconductor device may include a process of manufacturing the semiconductor device.

After the semiconductor device is prepared, a series of processes may be sequentially performed up to operation S240 of performing a second measurement on an error/error-suspicious area from operation S220 of performing a first measurement on the semiconductor device. Operation S220 of performing the first measurement on the semiconductor device, operation S230 of mining the error/error-suspicious area, and operation S240 of performing the second measurement on the error/error-suspicious area may respectively correspond to operation S110 of performing the first measurement on the measurement target, operation S130 of mining the error/error-suspicious area, and operation S150 of performing the second measurement on the error/error-suspicious area in the SI method of FIG. 13. Therefore, their detailed descriptions are omitted.

Subsequently, in operation S250, whether the semiconductor device is normal may be determined based on a first measurement result and/or a second measurement result. When the semiconductor device is normal (Yes), a subsequent process may be performed on the semiconductor device in operation S260. For example, the subsequent process performed on the semiconductor device may include a deposition process, an etching process, an ion process, and/or a cleaning process. Also, the subsequent process performed on the semiconductor device may include a test process performed on a semiconductor device of a wafer level. Furthermore, the subsequent process performed on the semiconductor device may include a process of individualizing a wafer into semiconductor chips and/or a process of packaging the semiconductor chips.

Otherwise, when the semiconductor device is abnormal (No), a cause may be analyzed and a corresponding process condition may be changed in operation S270. Here, the process condition may denote, for example, a process condition in a semiconductor process of manufacturing the semiconductor device. For example, in a lithography process, when a cause is a focus error, a focus position may be changed, and when the cause is a dose error, the amount of dose may be changed. Subsequently, operation S210 of preparing the semiconductor device may be performed. In operation S210 of preparing the semiconductor device, the semiconductor device may be a semiconductor device to which a changed process condition is applied.

While the inventive concept has been particularly shown and described with reference to example embodiments thereof, it will be understood that various changes in form and details may be made therein without departing from the scope of the following claims.

What is claimed is:

1. A multi-scale spectral imaging apparatus comprising:
a light source configured to generate and output light;
a stage having a measurement target thereon;
a line-scan spectral imaging (SI) optical system configured to:
  measure the measurement target using a first scale;
  slopingly irradiate the light from the light source onto the measurement target in a line beam shape;
  divide light reflected by the measurement target into divided light; and
  perform imaging of the divided light; and
an angle-resolved SI optical system configured to:
  measure the measurement target using a second scale that is smaller than the first scale;
  divide the light from the light source into monochromatic light;
  slopingly irradiate the monochromatic light onto the measurement target by using a reflective objective lens; and
  perform imaging of light reflected by the measurement target.

2. The multi-scale spectral imaging apparatus of claim 1, wherein the angle-resolved SI optical system is configured to measure the measurement target using the second scale without changing the stage after the line-scan SI optical system measures the measurement target using the first scale, and
wherein the first scale and the second scale comprise different pixel resolutions, respectively.

3. The multi-scale spectral imaging apparatus of claim 1, wherein the line-scan SI optical system comprises:
a first input optical system including a parabolic mirror configured to transfer the light from the light source to an optical fiber;
a second input optical system including a line beam forming mirror configured to convert light from the optical fiber into a line beam and to slopingly irradiate the line beam onto the measurement target;
a spectral device configured to divide light reflected by the measurement target into the divided light; and
a first detector configured to detect the divided light from the spectral device.

4. The multi-scale spectral imaging apparatus of claim 3, wherein the line-scan SI optical system further comprises a relay mirror optical system configured to transfer light reflected from the measurement target to the spectral device without distortion,
wherein the first detector is configured to detect a two-dimensional (2D) array image, and
wherein a first axial direction of the 2D array image corresponds to a line of the line beam and a second axial direction of the 2D array image corresponds to a wavelength.

5. The multi-scale spectral imaging apparatus of claim 1, wherein the angle-resolved SI optical system comprises:
a high speed spectral module configured to divide the light from the light source at a high speed;
an incident angle control module configured to irradiate light from the high speed spectral module onto the reflective objective lens using an angle-resolved method to control a slope of light incident on the measurement target;
the reflective objective lens;
a second detector configured to detect light reflected by the measurement target on a pupil surface; and
a third detector configured to detect the light reflected by the measurement target on an imaging surface of the third detector.

6. The multi-scale spectral imaging apparatus of claim 5, wherein the angle-resolved SI optical system further comprises a first beam splitter, a second beam splitter, and an imaging optical system that are each between the reflective objective lens and the third detector,
wherein the first beam splitter is configured to irradiate light from the incident angle control module onto the reflective objective lens and to irradiate the light reflected by the measurement target onto the second beam splitter,
wherein the second beam splitter is configured to irradiate a first portion of light from the first beam splitter onto the second detector and to irradiate a second portion of the light from the first beam splitter onto the third detector, and
wherein the imaging optical system is configured to transfer light from the second beam splitter to the third detector without distortion.

7. The multi-scale spectral imaging apparatus of claim 6, wherein the reflective objective lens comprises a main mirror of an aspherical mirror type and a secondary mirror of an aspherical mirror type that is between the main mirror and the measurement target,
wherein an open hole is in a center of the main mirror,
wherein the pupil surface is between the main mirror and the secondary mirror,
  wherein light from the first beam splitter is incident through the open hole, is reflected by the secondary mirror and is incident on the main mirror, and is reflected by the main mirror and is slopingly incident on the measurement target, and
  wherein an inclined angle controller of the incident angle control module is configured to change a position of light incident on the first beam splitter to change a focusing position of the light on the pupil surface to thereby control a slope of the light incident on the measurement target.

8. The multi-scale spectral imaging apparatus of claim 5, wherein the high speed spectral module comprises a diffraction grating and a galvano mirror and is configured to divide light based on a rotation of the galvano mirror.

9. The multi-scale spectral imaging apparatus of claim 5, wherein the incident angle control module comprises an inclined angle controller having a mirror type, a wavefront control type, or a translation type.

10. The multi-scale spectral imaging apparatus of claim 1, wherein at least one of the line-scan SI optical system or the angle-resolved SI optical system further comprises a polarization state generator (PSG) and a polarization state analyzer (PSA), and each of the PSG and the PSA comprises a rotary polarizer, or comprises a rotary polarizer and a compensator.

11. A multi-scale spectral imaging apparatus comprising:
a light source configured to generate and output light;
a stage having a measurement target thereon;
a line-scan spectral imaging (SI) optical system including a first input optical system including a parabolic mirror configured to transfer the light from the light source to an optical fiber, a second input optical system including a line beam forming mirror configured to convert light from the optical fiber into a line beam and to slopingly irradiate the line beam onto the measurement target, a spectral device configured to divide light reflected by the measurement target into divided light, and a first detector configured to detect the divided light from the spectral device; and
an angle-resolved SI optical system including a high speed spectral module configured to divide the light from the light source, an incident angle control module configured to perform control to slopingly irradiate light from the high speed spectral module onto the measurement target, a reflective objective lens configured to slopingly irradiate light from the incident angle control module onto the measurement target, a second detector configured to detect light reflected by the measurement target on a pupil surface, and a third detector configured to detect the light reflected by the measurement target on an imaging surface of the third detector.

12. The multi-scale spectral imaging apparatus of claim 11,
wherein the line-scan SI optical system further comprises a relay mirror optical system configured to transfer light reflected from the measurement target to the spectral device without distortion,
wherein the first detector is configured to detect a two-dimensional (2D) array image, and
wherein a first axial direction of the 2D array image corresponds to a line of the line beam and a second axial direction of the 2D array image corresponds to a wavelength.

13. The multi-scale spectral imaging apparatus of claim 11,
wherein the angle-resolved SI optical system further comprises a first beam splitter, a second beam splitter, and an imaging optical system that are each between the reflective objective lens and the third detector,
wherein the first beam splitter is configured to irradiate light from the incident angle control module onto the reflective objective lens and to irradiate light reflected by the measurement target onto the second beam splitter,
wherein the second beam splitter is configured to irradiate a first portion of light from the first beam splitter onto the second detector and to irradiate a second portion of the light from the first beam splitter onto the third detector, and
wherein the imaging optical system is configured to transfer light from the second beam splitter to the third detector without distortion.

14. The multi-scale spectral imaging apparatus of claim 11,
wherein the high speed spectral module comprises a diffraction grating and a galvano mirror and is configured to divide light based on a rotation of the galvano mirror, and
wherein the incident angle control module comprises an inclined angle controller having a mirror type, a wavefront control type, or a translation type.

15. The multi-scale spectral imaging apparatus of claim 13,
wherein the reflective objective lens comprises a main mirror of an aspherical mirror type and a secondary mirror of an aspherical mirror type that is between the main mirror and the measurement target,
wherein an open hole is in a center of the main mirror,
wherein the pupil surface is between the main mirror and the secondary mirror,
wherein the light from the first beam splitter is incident through the open hole, is reflected by the secondary mirror and is incident on the main mirror, and is reflected by the main mirror and is slopingly incident on the measurement target, and
wherein an inclined angle controller of the incident angle control module is configured to change a position of light incident on the first beam splitter to change a focusing position of the light on the pupil surface to thereby control a slope of the light incident on the measurement target.

* * * * *